(12) United States Patent
Sato et al.

(10) Patent No.: US 12,199,616 B2
(45) Date of Patent: Jan. 14, 2025

(54) CIRCUIT DEVICE, SENSOR MODULE, AND CIRCUIT PARAMETER ADJUSTMENT METHOD

(71) Applicant: Alps Alpine Co., Ltd., Tokyo (JP)

(72) Inventors: Hiroki Sato, Miyagi-ken (JP); Yasuhiko Sato, Miyagi-ken (JP); Hideki Yamazaki, Tokyo (JP); Katsuaki Morishita, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 68 days.

(21) Appl. No.: 18/137,054

(22) Filed: Apr. 20, 2023

(65) Prior Publication Data

US 2023/0261644 A1 Aug. 17, 2023

Related U.S. Application Data

(63) Continuation of application No. PCT/JP2021/032000, filed on Aug. 31, 2021.

(30) Foreign Application Priority Data

Oct. 28, 2020 (JP) .................................. 2020-180969

(51) Int. Cl.
*H03K 5/01* (2006.01)
*G01R 15/20* (2006.01)
*G01R 19/00* (2006.01)

(52) U.S. Cl.
CPC ............. *H03K 5/01* (2013.01); *G01R 15/205* (2013.01); *G01R 19/0092* (2013.01)

(58) Field of Classification Search
CPC ............ H03K 5/01; H03K 5/007; H03K 5/02; H03K 5/023; G01R 15/205; G01R 19/0092; G01R 31/319; G01R 19/165; G01R 19/16538; G01R 19/155; G01R 19/145
See application file for complete search history.

(56) References Cited

U.S. PATENT DOCUMENTS

2010/0309053 A1    12/2010   Asai et al.
2011/0032128 A1*    2/2011   Watanabe ........... H03M 1/1061
                                                                341/120

FOREIGN PATENT DOCUMENTS

JP        2010-281798       12/2010
WO    WO 2013/105451        7/2013

* cited by examiner

*Primary Examiner* — Jung Kim
(74) *Attorney, Agent, or Firm* — Crowell & Moring LLP

(57) ABSTRACT

In a first correction process, a correction value T(0) is set as a median value between minimum and maximum correction values Tmin(0) and Tmax(0). A provisional adjustment value B=T(0)+Bini is input to the circuit section. A signal value output from the circuit section in accordance with the provisional adjustment value B is obtained by an A/D converter, and the magnitude relationship between the signal value and a target value is determined. When the signal value is smaller than the target value, a value that is smaller than the correction value T(0) by an error tolerance is set as a new minimum correction value Tmin(1). The median value between the minimum correction value Tmin(1) and the maximum correction value Tmax(1)=Tmax(0) is set as a next correction value T(1). In the next correction process, the provisional adjustment value B=T(1)+Bini is input to the circuit section.

15 Claims, 13 Drawing Sheets

CIRCUIT DEVICE, SENSOR MODULE, AND CIRCUIT PARAMETER ADJUSTMENT METHOD

CLAIM OF PRIORITY

This application is a Continuation of International Application No. PCT/JP2021/032000 filed on Aug. 31, 2021, which claims benefit of priority to Japanese Patent Application No. 2020-180969 filed on Oct. 28, 2020. The entire contents of each application noted above are hereby incorporated by reference.

BACKGROUND

1. Field of the Disclosure

The present disclosure relates to a circuit device capable of adjusting circuit parameters, such as an offset and a gain, a sensor module including such a circuit device, and a circuit parameter adjustment method.

2. Description of the Related Art

In analog circuits that require high precision, such as a preamplifier that amplifies a signal output from a sensor, variations in circuit characteristics due to aging degradation or environmental effects may prevent output signal errors from meeting acceptable limits. Therefore, in analog circuits that require high precision, circuit parameters, such as an offset and a gain of an output signal, are required to be adjusted at appropriate timings (such as a timing after start of power supply). International Publication No. 2013/105451 discloses a current sensor capable of adjusting an offset and sensitivity. U.S. Patent Application Publication No. 2010/0309053 is an example of the related art.

A binary search method (also referred to as binary search) has been used as one of the methods for searching a set of numerical data for predetermined numerical data. The binary search method may be used to search for optimal adjustment values for an offset, a gain, and the like in an analog circuit.

FIG. 12 is a diagram illustrating a method for searching for adjustment values of circuit parameters using the binary search. In FIG. 12, "B1", "B2", and so on indicate adjustment values which are digital values of signals used to adjust an offset and a gain of an analog circuit. "A1", "A2", and so on indicate signal values obtained by an analog-to-digital converter (hereinafter referred to as an A/D converter) from an output signal of the analog circuit.

In the example in FIG. 12, first, a range from adjustment values B1 to B7, indicated by hatched lines, is set as a search range, and an adjustment value B2, which is a median value of the search range, is set in the analog circuit. When a signal value A2' of a signal output from an analog circuit is obtained by the A/D converter in accordance with the set adjustment value B2, the signal value A2' is compared with a predetermined target value Atg. Since the signal value A2' is smaller than the target value Atg in the example in FIG. 12, a range (between the adjustment values B2 and B7) equal to or larger than the median value (the adjustment value B2) in the range from the current adjustment values B1 to B7 is selected as a new search range.

Also, in the new search range (between the adjustment values B2 to B7), an adjustment value B6, which is a median value, is set in the analog circuit, and a signal value A6' of an output signal in accordance with the adjustment value B6 is obtained by the A/D converter and compared with a target value Atg. Since the signal value A6' is larger than the target value Atg in the example in FIG. 12, a range (between the adjustment values B2 and B6) equal to or smaller than the median value (the adjustment value B6) among the current adjustment values B2 to B7 is selected as a new search range. Thereafter, the search range for adjustment values is narrowed by half at each stage by a similar procedure as shown in FIG. 12.

However, in the method for adjusting circuit parameters using the binary search described above, it is assumed that adjustment values set in the analog circuit exactly correspond to signal values of output signals. When there is an error between a signal value to be obtained for an adjustment value set in the analog circuit and a signal value actually obtained, an inappropriate search range may be selected by the binary search and a signal value of an output signal may not be brought close to a target value.

FIG. 13 is a diagram schematically illustrating a change of a level of an output signal in accordance with a change in an adjustment value for an offset or the like. When the adjustment value is changed in a step-like manner, the level of the output signal converges to a certain level over time while changing in accordance with transient response characteristics of a circuit as shown in a first and second response examples in FIG. 13. Assuming here that the level of the output signal converges to a certain level Vx when an adjustment value Bx is set, when the level of the output signal changes as shown in the first and second response examples, a signal value obtained by the A/D converter may differ depending on a timing of A/D conversion. In the example in FIG. 13, a signal value obtained by the A/D converter in a period Tx1 has a larger error from an original signal value (corresponding to Vx) than a signal value obtained in a period Tx2.

The signal values A2 to A6 in FIG. 12 are to be originally obtained in accordance with the adjustment values B2 to B6, respectively. The signal values A2', A3', A4', and A6' actually obtained in accordance with the adjustment values B2, B3, B4, and B6, respectively, have errors with respect to the signal values A2, A3, A4, and A6, respectively, to be originally obtained.

The signal value A6' actually obtained when the adjustment value B6 is set is larger than the target value Atg. On the other hand, the signal value A6 to be originally obtained when the adjustment value B6 is set is smaller than the target value Atg. In the example in FIG. 12, the range from the adjustment value B2 to the adjustment value B6 is selected as a next search range after the range from the adjustment value B2 to the adjustment value B7, but since the original signal value A6 is smaller than the target value Atg, a range from the adjustment value B6 to the adjustment value B7 is to be selected as the next search range, that is, the selected search range is wrong.

Even when the wrong search range (B2 to B6) is further narrowed down, the search range does not include an adjustment value Btg corresponding to the target value Atg, and therefore, a certain error between a signal value of an output signal and the target value Atg may not be reduced.

To avoid such a problem with the binary search, for example, a timing of conversion by the A/D converter may be delayed or a speed of a transient response of an output of the analog circuit may be increased. However, when the timing of conversion by the A/D converter is delayed, another problem arises, that is, a period of time required for adjustment is increased, and therefore, the adjustment may not be completed within a limited period of time. Furthermore, in general, the transient response of the output of an analog circuit varies with a load connected to the output, and usually the heavier the load, the slower the output response speed tends to be. Therefore, it may be difficult to achieve a fast output transient response under a variety of loading conditions.

SUMMARY

The present disclosure has been made in view of such circumstances, and provides a circuit device capable of searching for an optimal adjustment value at which a desired output signal is obtained even when a signal value of an output signal is in error with respect to the adjustment value for adjusting circuit parameters, a sensor module including the circuit device, and a method for adjusting circuit parameters in the circuit device.

According to a first aspect of the present disclosure, a circuit device includes a circuit section that has circuit parameters relating to characteristics of an output signal and that adjust the circuit parameters in accordance with an input adjustment value, an analog-to-digital converter that converts an analog signal output from the circuit section into a digital signal and that outputs a signal value corresponding to a level of the output signal, and a processing section that is configured to repeatedly perform a correction process of correcting the adjustment value so that the signal value output from the analog-to-digital converter becomes close to a target value in an operation mode for adjustment of the circuit parameters. The correction process includes obtaining, after a provisional adjustment value that is the adjustment value in a correction step is input to the circuit section, the signal value of the output signal output from the circuit section, from the analog-to-digital converter in accordance with the input provisional adjustment value, and correcting the provisional adjustment value in accordance with the obtained signal value. The correcting includes determining the magnitude relationship between the obtained signal value and the target value, setting, when a first determination result is obtained in the determining, a value that is smaller than a median value between a preset minimum value and a preset maximum value by an error tolerance and that is larger than the original minimum value as the new minimum value, setting, when a second determination result that is opposite to the first determination result is obtained in the determining, a value that is larger than the median value by the error tolerance and that is smaller than the original maximum value, as the new maximum value, and obtaining the new provisional adjustment value based on a median value between the minimum value newly set in the setting and the maximum value or a median value between the maximum value newly set in the setting and the minimum value.

According to the circuit device of the first aspect, in the operation mode for adjusting the circuit parameters, the correction process is repeatedly performed to correct the adjustment value so that the signal value output from the analog-to-digital converter approaches a target value.

In the correction process, the provisional adjustment value is input to the circuit section, the output signal according to the provisional adjustment value is output from the circuit section, and the signal value according to a level of the output signal is output from the analog-to-digital converter. Then, the provisional adjustment value is corrected in accordance with the signal value obtained from the analog-to-digital converter.

In the above process of correcting the provisional adjustment value in accordance with the obtained signal value, the obtained signal value is first compared with the target value, and the magnitude relationship between the two is determined. When a result of the determination of the magnitude relationship between the obtained signal value and the target value is a first determination result, a new minimum value is set that is larger than the original minimum value. When the result of the determination of the magnitude relationship between the obtained signal value and the target value is a second determination result, which is opposite to the first determination result, a new maximum value is set that is smaller than the original maximum value. Then, the new provisional adjustment value is obtained based on the median value between the new minimum value and the maximum value which have been set, or between the new maximum value and the minimum value which have been set. The obtained new provisional adjustment value is input to the circuit section in a next correction process.

Therefore, each time a new minimum value or a new maximum value is set in the correction process, a range between the minimum value and the maximum value becomes narrower, and a range of possible values for the median value also becomes narrower, thus narrowing a range of the adjustment value to be obtained based on the median value.

Here, when the new minimum value that is larger than the original minimum value is set, a value that is smaller than the median value (the original median value) between the original minimum value and the maximum value by the error tolerance is set as the new minimum value.

Accordingly, when compared with a case where the new minimum value is equal to the original median value, a range of a possible median value (a range from the minimum value to the maximum value) in the correction processing becomes wider in the subsequent correction process.

On the other hand, when the new maximum value that is smaller than the original maximum value is set, a value that is larger than the median value (the original median value) between the original maximum value and the minimum value by the error tolerance is set as the new maximum value.

Accordingly, when compared with a case where the new maximum value is equal to the original median value, a range of a possible median value (a range from the minimum value to the maximum value) in the correction processing becomes wider in the subsequent correction process.

In this way, since the range of possible values for the median value (the range from the minimum value to the maximum value) is expanded by the error tolerance, even when the signal value to be obtained in accordance with the provisional adjustment value has an error with respect to the original signal value, the median value to obtain an optimal adjustment value is easily included in this range. In other words, even when the signal value of the output signal of the circuit section causes an error, it is possible to search for an optimal adjustment value for attaining the desired output signal.

According to a second aspect of the present disclosure, a sensor module includes the circuit device according to the first aspect, and a sensor section that outputs a signal in accordance with a physical amount. The amplifier section of the circuit device receives a signal output from the sensor section as the input signal.

According to the sensor module according to the second aspect, the offset component and the gain may be automatically adjusted in the amplifier section that amplifies the signal from the sensor section.

The sensor section preferably outputs a detection signal corresponding to a current to be detected, and the amplifier section receives the detection signal as the input signal.

According to a third aspect of the present disclosure, a circuit parameter adjustment method is executed by a processing section of a circuit device. The circuit device includes a circuit section that has circuit parameters relating to characteristics of an output signal and that adjust the circuit parameters in accordance with an input adjustment value, and an analog-to-digital converter that converts an analog signal output from the circuit section into a digital signal and that outputs a signal value corresponding to a level of the output signal. The processing section repeatedly performs a correction process of correcting the adjustment value so that the signal value output from the analog-to-digital converter becomes close to a target value. The correction process includes obtaining, after a provisional adjustment value that is the adjustment value in a correction step is input to the circuit section, the signal value of the output signal output from the circuit section, from the analog-to-digital converter in accordance with the input provisional adjustment value, and correcting the provisional adjustment value in accordance with the obtained signal value. The correcting includes determining the magnitude relationship between the obtained signal value and the target value, setting, when a first determination result is obtained in the determining, a value that is smaller than a median value between a preset minimum value and a preset maximum value by an error tolerance and that is larger than the original minimum value as the new minimum value, setting, when a second determination result that is opposite to the first determination result is obtained in the determining, a value that is larger than the median value by the error tolerance and that is smaller than the original maximum value, as the new maximum value, and calculating the new provisional adjustment value based on a median value between the minimum value newly set in the setting and the maximum value or a median value between the maximum value newly set in the setting and the minimum value.

DESCRIPTION OF THE EXEMPLARY EMBODIMENTS

First Embodiment

Figure 1:
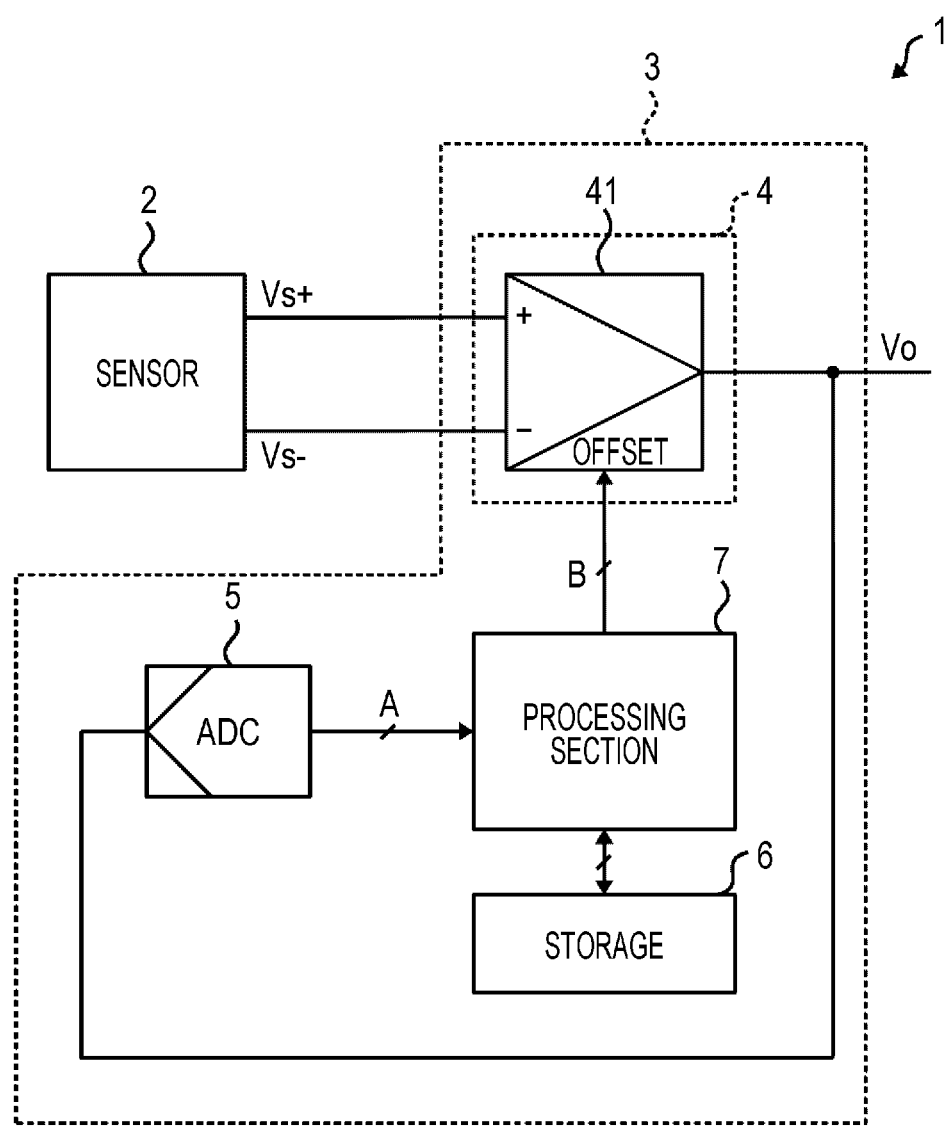
FIG. 1 is a diagram illustrating an example of a configuration of a sensor module according to a first embodiment.

FIG. 1 is a diagram illustrating an example of a configuration of a sensor module 1 according to a first embodiment. The sensor module 1 illustrated in FIG. 1 has a sensor section 2 and a circuit device 3.

The sensor section 2 is a device that outputs a signal in accordance with a physical quantity. The sensor section 2 includes a sensor element that detects physical quantities of magnetism, acceleration, vibration, strain, light, temperature, humidity, and the like and outputs electrical signals corresponding to the physical quantities. In the example of FIG. 1, the sensor section 2 outputs differential signals (Vs+ and Vs−) in accordance with a detected physical quantity.

The circuit device 3 receives the signals output from the sensor section 2 and performs predetermined signal processing. In the example of FIG. 1, the circuit device 3 includes a circuit section 4, an A/D converter 5, a storage 6, and a processing section 7.

[Circuit Section 4]

The circuit section 4 has circuit parameters (an offset, a gain, and the like) related to characteristics of a signal to be output, and the circuit parameters may be adjusted in accordance with an adjustment value B to be supplied from the processing section 7. A level of an output signal Vo of the circuit section 4 monotonically changes with respect to a change in the adjustment value B. Specifically, a level of the output signal Vo of the circuit section 4 monotonically changes in one direction as the adjustment value B increases, and monotonically changes in an opposite direction as the value of the adjustment value B decreases.

As the example below, it is assumed that the level (e.g., a voltage) of the output signal Vo monotonically increases as the value of the adjustment value B increases, and the level of the output signal Vo monotonically decreases as the value of the adjustment value B decreases.

In the example of FIG. 1, the circuit section 4 includes an amplifier section 41 capable of adjusting an offset component represented in the output signal Vo in accordance with the adjustment value B. The amplifier section 41 receives and amplifies differential signals (Vs+, Vs−) output from the sensor section 2, and outputs an output signal Vo as a signal indicating a result of the amplification.

[A/D Converter 5]

The A/D converter 5 converts the output signal Vo of the circuit section 4, which is an analog signal, into a digital signal and outputs a signal value A corresponding to the level of the output signal Vo.

[Storage 6]

The storage 6 stores instructions of programs to be executed in the processing section 7 and data (such as an initial value Bini and the target value Atg) to be used in processing performed by the processing section 7. The storage 6 includes one or more types of storage devices, such as a flash memory, a DRAM, an SRAM, and a hard disk.

[Processing Section 7]

The processing section 7 is a circuit that controls entire operation of the circuit device 3 and includes one or more processors (such as a CPU and a DSP) that are configured to perform processing in accordance with the instructions of programs stored in the storage 6, for example. The processing section 7 may also include dedicated hardware (such as ASIC or FPGA) configured to perform a specific function. The processing performed by the processing section 7 (for example, processing related to adjustment of circuit parameters) may be realized by a processor included in the processing section 7 that executes an instruction of a program or at least a portion of the processing may be realized by dedicated hardware.

In an operation mode for adjusting circuit parameters, the processing section 7 repeatedly performs a correction process of correcting the adjustment value B so that the signal value A output from the A/D converter 5 approaches the target value Atg. The target value Atg is the signal value A obtained when the adjustment value B is adjusted so that a measured value of the output signal Vo of the circuit section 4 approaches a predetermined value, and is obtained by inspection performed in advance and stored in the storage 6. The adjustment value B adjusted so that the measured value of the output signal Vo of the circuit section 4 approaches the predetermined value is stored in the storage 6 as an initial value Bini.

The processing section 7 inputs the adjustment value B in a correction process (hereinafter referred to as a "provisional adjustment value B") to the circuit section 4 in each repetitive correction process, and obtains the signal value A of the output signal Vo output from the circuit section 4 in accordance with the input provisional adjustment value B from the A/D converter 5. When acquiring the signal value A from the A/D converter 5, the processing section 7 corrects the provisional adjustment value B in accordance with the acquired signal value A.

In the process of correcting the provisional adjustment value B in accordance with the signal value A, the processing section 7 determines the magnitude relationship between the signal value A acquired from the A/D converter 5 and the target value Atg.

When a first determination result (e.g., Atg>A) is obtained as a result of the determination of the magnitude relationship between the signal value A and the target value Atg, the processing section 7 sets a new minimum correction value Tmin that is smaller than a median value between a preset minimum correction value Tmin and a preset maximum correction value Tmax by an error tolerance Er and that is larger than an original minimum correction value.

The new minimum correction value Tmin(NEW) is calculated by the following formula.

$$Tmin(NEW)=\{(Tmin+Tmax)/2\}-Er \quad (1)$$

Note that the new minimum correction value Tmin(NEW) is larger than an original minimum correction value Tmin (OLD).

$$Tmin(NEW)>Tmin(OLD) \quad (2)$$

On the other hand, when a second determination result (e.g., Atg≤A), which is opposite to the first determination result, is obtained as a result of the determination of the magnitude relationship between the signal value A and the target value Atg, the processing section 7 sets a new maximum correction value Tmax that is larger than a median value between the minimum correction value Tmin and the maximum correction value Tmax by the error tolerance Er and is smaller than the original maximum correction value Tmax.

The new maximum correction value Tmax(NEW) is calculated by the following formula.

$$Tmax(NEW)=\{(Tmin+Tmax)/2\}+Er \quad (3)$$

However, the new maximum correction value Tmax (NEW) is smaller than the original maximum correction value Tmax(OLD).

$$Tmax(NEW)<Tmax(OLD) \quad (4)$$

The minimum and maximum correction values Tmin and Tmax individually have initial values stored in the storage 6. In the correction process performed first, the processing section 7 individually sets the minimum and maximum correction values Tmin and Tmax to their initial values.

The processing section 7 sets a new minimum correction value Tmin or a maximum correction value Tmax for each correction process. When the processing section 7 newly sets a minimum correction value Tmin or a maximum correction value Tmax in a correction process, a range from the minimum correction value Tmin to the maximum correction value Tmax after the setting is included in a range from a minimum correction value Tmin to a maximum correction value Tmax before the setting, and a width of the range after the setting is narrower than a width of the range before the setting. Therefore, each time the processing section 7 repeats the correction process, the range from the minimum correction value Tmin to the maximum correction value Tmax becomes narrower, and therefore, the range in which the median value between the minimum correction value Tmin and the maximum correction value Tmax may be taken is narrowed.

When newly setting the minimum correction value Tmin or the maximum correction value Tmax, the processing section 7 calculates a new provisional adjustment value B accordingly. In other words, when setting a new minimum correction value Tmin in accordance with the first determination result, the processing section 7 obtains a new provisional adjustment value B based on the median value between the new minimum correction value Tmin and the maximum correction value Tmax. When newly setting the maximum correction value Tmax in accordance with the second determination result, the processing section 7 newly obtains the provisional adjustment value B based on a median value between the new maximum correction value Tmax and the minimum correction value Tmin.

As an example, the processing section 7 inputs a sum of the initial value Bini and the correction value T as the adjustment value (the provisional adjustment value) B to the circuit section 4. In this case, the adjustment value (the provisional adjustment value) B is expressed by the following formula.

$$B=T+Bini \quad (5)$$

When calculating the adjustment value B based on formula (5), the processing section 7 calculates a median value between the minimum correction value Tmin and the maximum correction value Tmax as the correction value T. In this case, the correction value T is expressed by the following formula.

$$T=(Tmin+Tmax)/2 \qquad (6)$$

When the minimum correction value Tmin is newly set in accordance with the first determination result, the processing section 7 calculates a value (formula (5)), as the provisional adjustment value B, by adding the initial value Bini to the correction value T (formula (6)) which is the median value between the new minimum correction value Tmin and the maximum correction value Tmax and inputs the provisional adjustment value B to the circuit section 4. When the maximum correction value Tmax is newly set in accordance with the second determination result, the processing section 7 calculates a value (formula (5)), as the provisional adjustment value B, by adding the initial value Bini to the correction value T (formula (6)) which is the median value between the new maximum correction value Tmax and the minimum correction value Tmin and inputs the provisional adjustment value B to the circuit section 4.

The processing section 7 updates the error tolerance Er, which is used when newly setting the minimum correction value Tmin by formula (1) or newly setting the maximum correction value Tmax by formula (3) every time the correction process is performed. Specifically, the processing section 7 updates the error tolerance Er to be used in a next correction process to a value smaller than the original error tolerance Er. As the error tolerance Er decreases with each correction process, a range of a possible median value from the minimum correction value Tmin to the maximum correction value Tmax decreases with each correction process. Therefore, a range of adjustment value B obtained based on the median value (the correction value T) is also narrowed down each time the correction process is repeated.

The processing section 7 obtains, for example, an updated error tolerance Er based on a difference between a latest provisional adjustment value B(NEW) and a provisional adjustment value B(OLD) one before the latest provisional adjustment value. The updated error tolerance Er is calculated, for example, by the following formula.

$$Er=\beta \times |B(NEW)-B(OLD)| \qquad (7)$$

When the latest provisional adjustment value B(NEW) and the previous provisional adjustment value B(OLD) are expressed by a latest correction value T(NEW) and a previous correction value T(OLD) as "B(NEW)=T(NEW)+BiniB(OLD)=T(OLD)+Bini", the error tolerance Er is calculated by the following formula.

$$Er=\beta \times |T(NEW)-T(OLD)| \qquad (8)$$

"β" in formulae (7) and (8) is a coefficient set so that the error tolerance Er is reduced with each correction process, and is set to a value smaller than 1, for example.

Note that the processing section 7 may obtain a value of an arbitrary function having the difference (|B(NEW)−B(OLD)|) between the latest provisional adjustment value B(NEW) and the provisional adjustment value B(OLD) one before the latest provisional adjustment value as a variable, as the updated error tolerance Er. This function may be realized using a numerical value table stored in advance, for example, in the storage 6.

In each correction process repeatedly performed, the processing section 7 determines whether an error (|Atg−A|) between the signal value A obtained from the A/D converter 5 and the target value Atg is within an allowable range LIM. When the error (|Atg−A|) is within the allowable range LIM, the processing section 7 determines the provisional adjustment value B input to the circuit section 4 at this time as a correction result of the adjustment value.

A method for automatically adjusting an offset of the circuit section 4 (the amplifier section 41) of the circuit device 3 in the sensor module 1 having the configuration described above will now be described.

Figure 2:
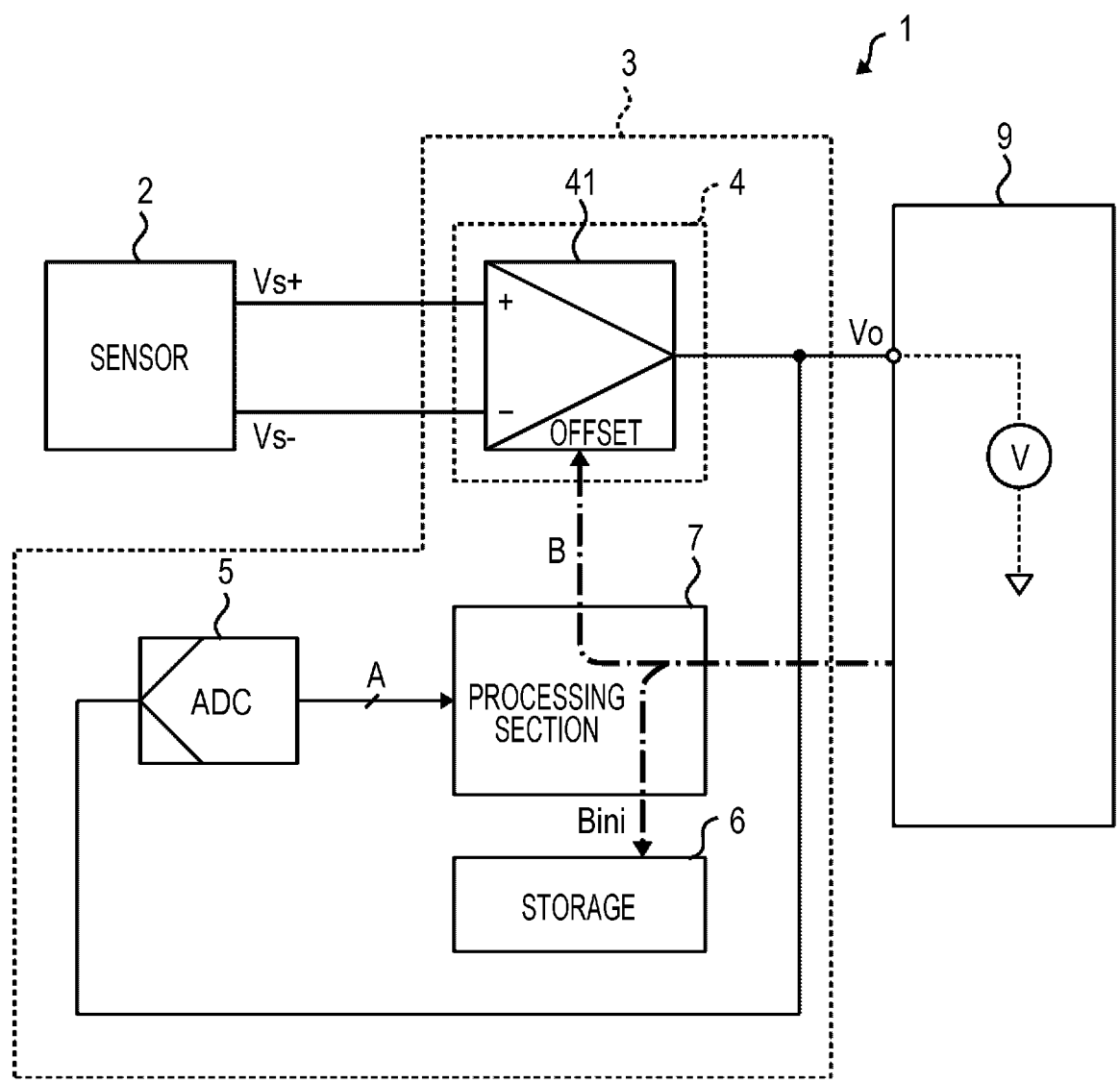
FIG. 2 is a diagram illustrating an example of a method for obtaining an initial value of an adjustment value in the sensor module illustrated in FIG. 1.

FIG. 2 is a diagram illustrating an example of a method for obtaining the initial value Bini of the adjustment value B in the sensor module 1 illustrated in FIG. 1.

For example, as shown in FIG. 2, an inspection device 9 capable of measuring a signal level (a voltage in the example in FIG. 2) of the output signal Vo is connected to an output of the circuit device 3. The inspection device 9 controls the adjustment value B to be input to the circuit section 4 (the amplifier section 41) of the circuit device 3 when the sensor section 2 is in a no-input state (a state in which no physical quantity is detected), and measures a signal level of the output signal Vo. The inspection device 9 measures the output signal Vo while changing the adjustment value B to be input to the circuit section 4 (the amplifier section 41) of the circuit device 3, and searches for the adjustment value B that brings the signal level of the output signal Vo closest to a predetermined target value. The inspection device 9 stores the adjustment value B found by the search in the storage 6 as the initial value Bini.

Figure 3:
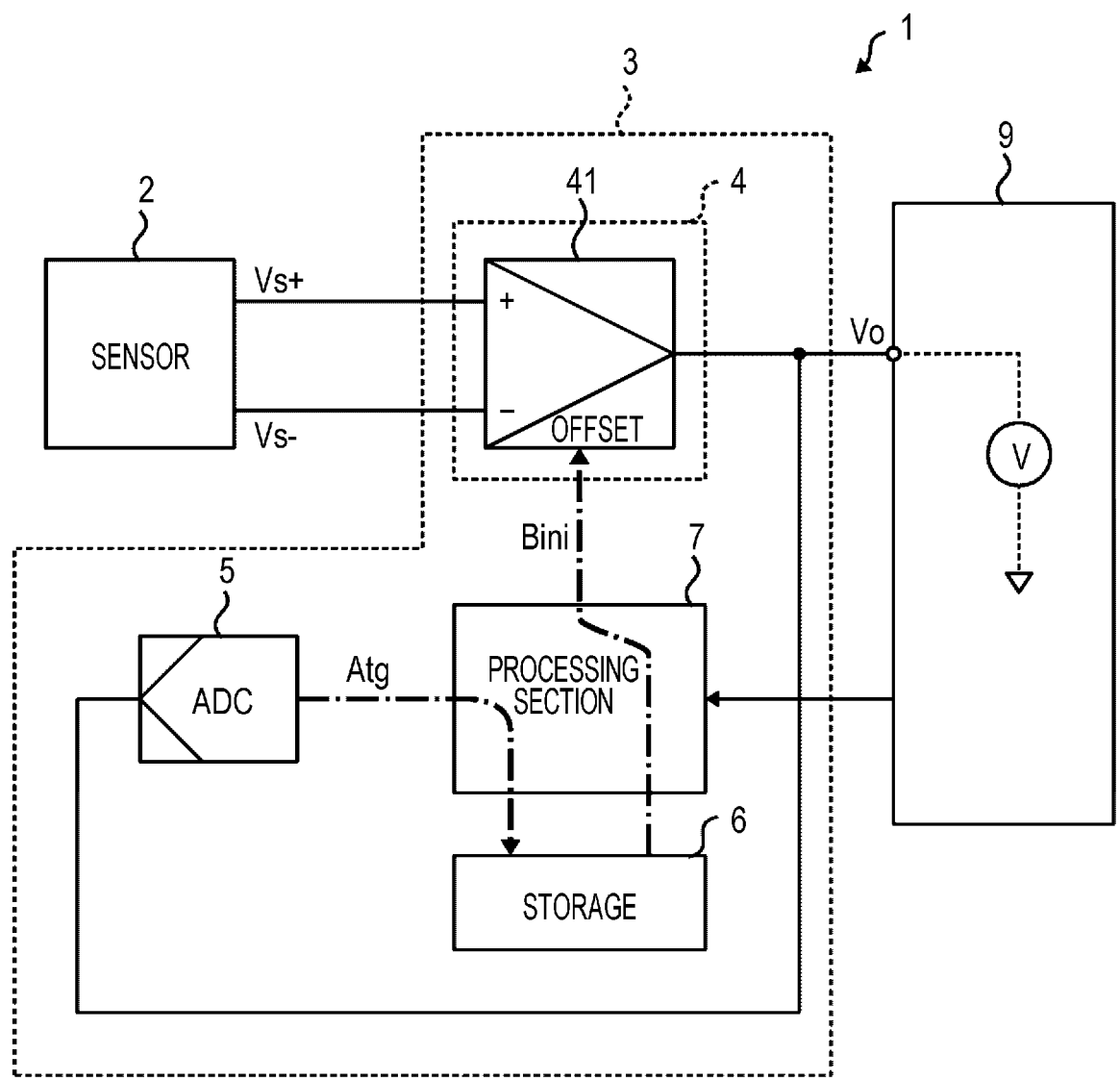
FIG. 3 is a diagram illustrating an example of a method for obtaining a target value in the sensor module illustrated in FIG. 1.

FIG. 3 is a diagram illustrating an example of a method for obtaining the target value Atg in the sensor module 1 illustrated in FIG. 1. After obtaining the initial value Bini by the method shown in FIG. 2, the inspection device 9 inputs the obtained initial value Bini to the circuit section 4 (the amplifier section 41). The inspection device 9 confirms that the signal level of the output signal Vo is close to the predetermined target value and issues an instruction for obtaining the signal value A of the A/D converter 5 to the processing section 7. The processing section 7 stores the signal value A obtained from the A/D converter 5 as the target value Atg in the storage 6.

Figure 4:
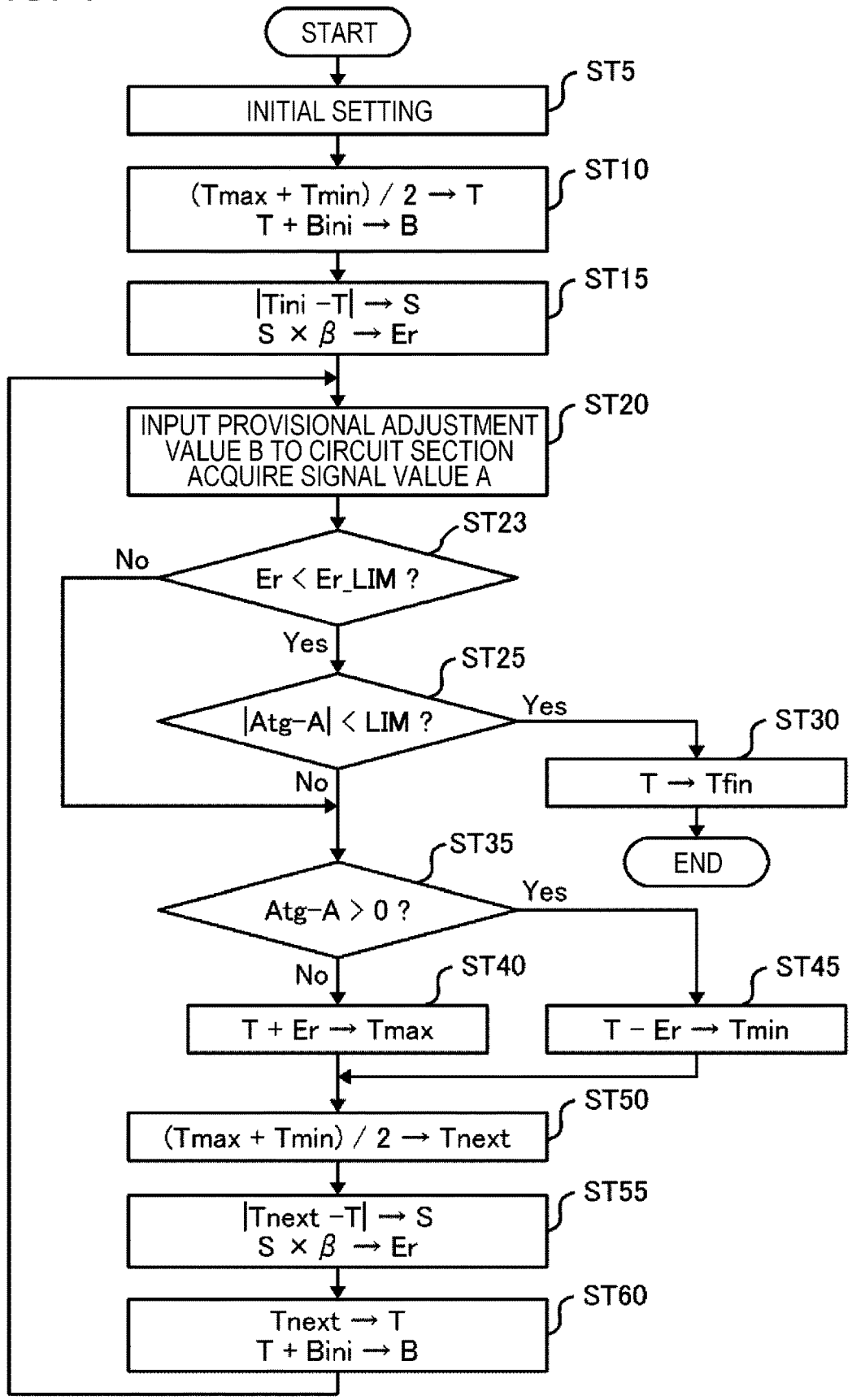
FIG. 4 is a flowchart for describing a circuit parameter adjustment method in the sensor module according to the first embodiment.

FIG. 4 is a flowchart of a circuit parameter adjustment method employed in the sensor module 1. The process illustrated in FIG. 4 is performed after the initial value Bini and the target value Atg obtained in the manner described above are stored in the storage 6, for example, when the power is turned on from off, when a sensing operation is started, or when an instruction for executing offset adjustment is input.

When starting the adjustment, the processing section 7 of the circuit device 3 initializes constants and variables to be used in the process (ST5). For example, the processing section 7 reads pre-obtained data, such as the initial value Bini, the target value Atg, and the coefficient β from the storage 6 and sets them as individual constants, and reads initial values of the variables, such as the maximum correction value Tmax and the minimum correction value Tmin from the storage 6 and sets them as individual variables.

Furthermore, when starting the adjustment, the processing section 7 calculates an initial value of the provisional adjustment value B to be used for processing (ST10). For example, the processing section 7 calculates an initial value of the correction value T according to formula (6) and an initial value of the provisional adjustment value B according to formula (5).

Furthermore, when starting the adjustment, the processing section 7 calculates an initial value of the error tolerance Er used in the processing (ST15). For example, the processing section 7 obtains a current correction value T which has already been input to the circuit section 4 as "Tini" and multiplies an absolute value $S(=|Tini-T|)$ of a difference between the correction value T calculated by formula (6) and the current correction value Tini by the coefficient β so as to calculate an initial value of the error tolerance $Er(=S\times\beta=|Tini-T|\times\beta)$.

Note that, instead of calculation of initial values of the adjustment value B and the error tolerance Er described above, the processing section 7 may read the initial values stored in the storage 6 in advance and set the initial values as the respective variables.

After initializing the constants and the variables to be used in the processing (ST5 to ST15), the processing section 7 repeatedly performs the correction process in step ST20 to step ST60 which will be described below.

The processing section 7 inputs the provisional adjustment value B of the correction process to the A/D converter 5, and obtains from the A/D converter 5 the signal value A of the output signal Vo output from the circuit section 4 in accordance with the input provisional adjustment value B (ST20).

The processing section 7 determines whether the error tolerance Er is smaller than a predetermined threshold Er_LIM (ST23). When it is determined that the error tolerance Er is smaller than the threshold Er_LIM (Yes in ST23), the processing section 7 proceeds to step ST25 (determination of an end of repetition of the correction process) which will be described below. When it is determined that the error tolerance Er is equal to or larger than the threshold Er_LIM (No in ST23), the processing section 7 proceeds to step ST35 without executing the process in step ST25. As a result, the processing section 7 repeatedly performs the correction process in steps ST20 to ST60 until the error tolerance Er becomes smaller than the threshold Er_LIM so as to repeatedly update the error tolerance Er (step ST55 below). In other words, the processing section 7 does not proceed to step ST25 described below (determination of the end of repetition of the correction process) until the error tolerance Er becomes sufficiently small (until the condition Er<Er_LIM is satisfied). Since the signal value A obtained from the A/D converter 5 may include some error, when the repetition of the correction process is terminated with a large error tolerance Er, the adjustment value B obtained as a result of the correction may include an error larger than an allowable range. Therefore, by repeatedly performing the correction process until the error tolerance Er becomes sufficiently small, occurrence of a case where the resulting adjustment value B includes a large error may be reduced.

Proceeding to step ST25, the processing section 7 calculates an error (|Atg−A|) between the signal value A obtained from the A/D converter 5 and the target value Atg, and determines whether the calculated error (|Atg−A|) is within the allowable range LIM. When the error (|Atg−A|) is within the allowable range LIM (Yes in ST25), the processing section 7 determines the correction value T of the adjustment value B input to the circuit section 4 in step ST20 as a final correction value Tfin and stores the final correction value Tfin in the storage 6 (ST30).

The adjustment value B obtained as a result of the correction is calculated by summing the correction value Tfin and the initial value Bini (Tfin+Bini).

When the error (|Atg−A|) is not included in the allowable range LIM (No in ST25), the processing section 7 corrects the current provisional adjustment value B in accordance with the signal value A obtained in step ST20 by a process performed in steps ST35 to ST60.

Proceeding to step ST35, the processing section 7 determines the magnitude relationship between the signal value A obtained in step ST20 and the target value Atg. When a first determination result indicating that the signal value A is smaller than the target value Atg is obtained (Yes in ST35), the processing section 7 newly sets the minimum correction value Tmin that is smaller than the median value between the minimum correction value Tmin and the maximum correction value Tmax by the error tolerance Er and larger than the original minimum correction value Tmin (ST45).

On the other hand, when a second determination result (A≥Atg), which is opposite to the first determination result is obtained (No in ST35), the processing section 7 newly sets the maximum correction value Tmax that is larger than the median value between the minimum correction value Tmin and the maximum correction value Tmax by the error tolerance Er and smaller than the original maximum correction value Tmax (ST40).

After the maximum correction value Tmax or the minimum correction value Tmin is newly set in step ST40 or step ST45, the processing section 7 calculates a median value between the minimum correction value Tmin and the maximum correction value Tmax as a correction value Tnext of the provisional adjustment value B to be used in a next correction process (ST50).

The processing section 7 calculates an error tolerance $Er(=S\times\beta=|Tini-T|\times\beta)$ to be used in the next correction process by multiplying the absolute value $S(=|Tnext-T|)$ of a difference between a current correction value T which has been already input to the circuit section 4 and the correction value Tnext calculated in step ST50 by the coefficient β (ST55). The absolute value S of the difference between the correction value T and the correction value Tnext (=|Tnext−T|) indicates a magnitude of a change in the provisional adjustment value B between one correction process and the next, and may be referred to as an "adjustment value change amount S" in the following description.

The processing section 7 may calculate the error tolerance Er by numerical calculation, or may obtain the error tolerance Er based on a numerical value table or the like stored beforehand in the storage 6. In the latter case, for example, the numerical value table has a one-to-one correspondence between a plurality of numerical value ranges and a plurality of error tolerances Er, which may include the adjustment value change amount $S(=|Tnext-T|)$. The processing section 7 identifies the numerical value range including the calculated adjustment value change amount $S(=|Tnext-T|)$, and obtains the error tolerance Er associated with the numerical value range from the numerical value table.

The processing section 7 sets the correction value Tnext calculated in step ST50 as the new correction value T and calculates a sum of the new correction value T and the initial value Bini as a new provisional adjustment value B (ST60).

After step ST35 to step ST60, the processing section 7 returns to step ST20 and repeatedly performs the correction process described above from step ST20 onward.

Figure 5:
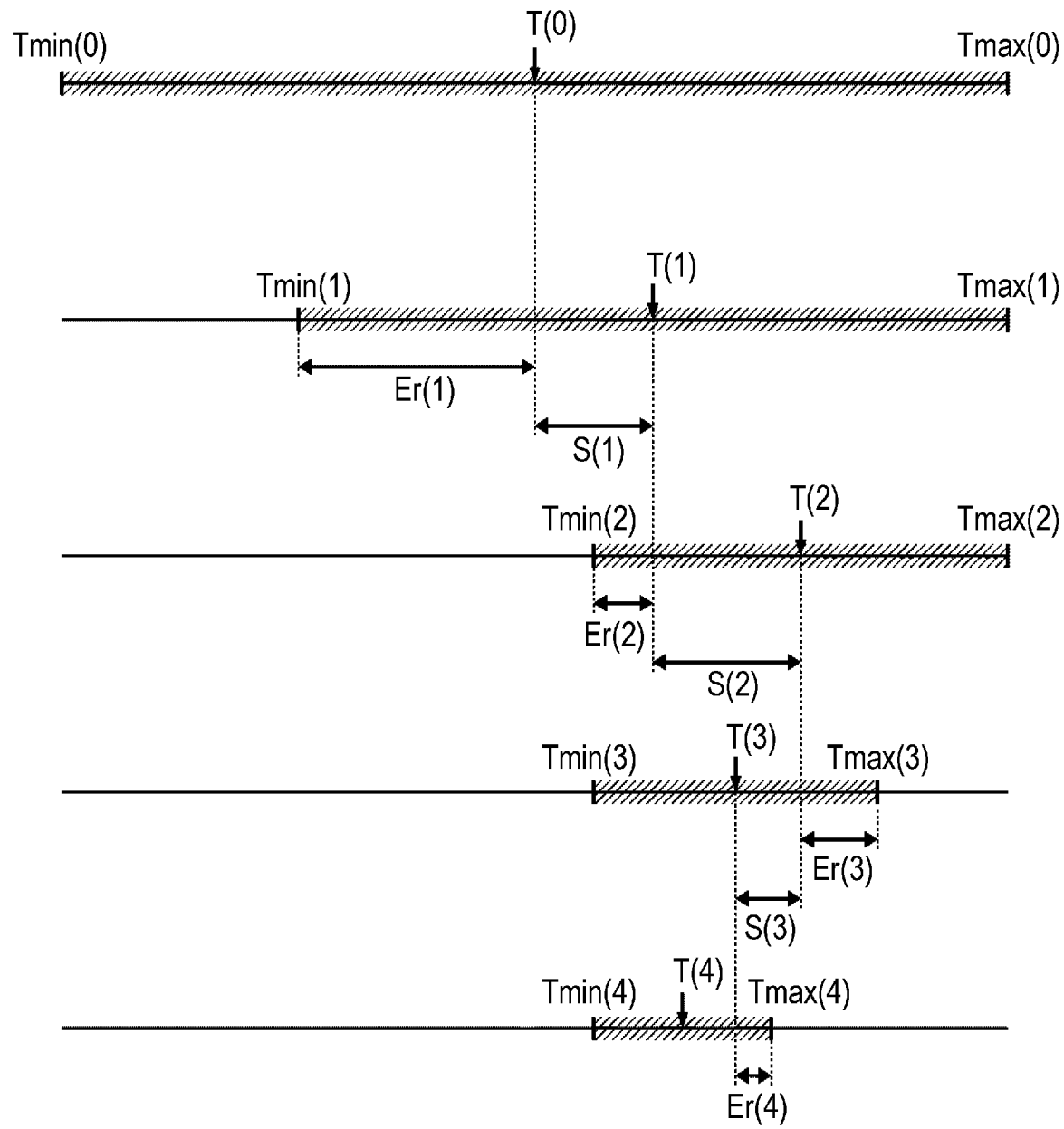
FIG. 5 is a diagram illustrating an example of a method for calculating a correction value for a provisional adjustment value in a correction process.

FIG. 5 is a diagram illustrating an example of a method for calculating the correction value T of the provisional adjustment value B in the correction process. In FIG. 5, numbers in brackets to the right of "T", "Tmin", "Tmax", "Er", and "S" indicate the number of times the correction process is performed.

When the correction process is started, the minimum and maximum correction values Tmin(0) and Tmax(0) are set to predetermined initial values, respectively. The minimum correction value Tmin(0) is a smallest value that the correction value T can take in a subsequent correction process, and the maximum correction value Tmax(0) is a largest value that the correction value T can take in the subsequent correction process. The range from the minimum correction value Tmin(0) to the maximum correction value Tmax(0) indicated by the hatched line is a search range for the correction value T.

A median value between the minimum correction value Tmin(0) and the maximum correction value Tmax(0) is the correction value T(0). When the first correction process is executed, a sum of the correction value T(0) and the initial value Bini is input to the circuit section 4 as the provisional adjustment value B, the signal value A of the output signal Vo is obtained from the A/D converter 5, and the magnitude relationship between the signal value A and the target value Atg is determined. In the example in FIG. 5, since the signal value A obtained in accordance with the correction value T(0) is smaller than the target value Atg, a portion of the range where the signal value A is expected to be smaller than the current value (a portion of a range smaller than the correction value T(0)) is excluded from the search range. In other words, a value that is smaller than the correction value T(0) serving as the median value by the error tolerance Er(1) is newly set as the minimum correction value Tmin(1). A maximum correction value Tmax(1) is the same as the maximum correction value Tmax(0). As a result, the search range for the new correction value T (Tmin(1) to Tmax(1)), indicated by the hatched line, is narrower than the previous search range (Tmin(0) to Tmax(0)).

Once the minimum correction value Tmin(1) and the maximum correction value Tmax(1) are determined, a correction value T(1) which is a median of these values is calculated. Based on an adjustment value change amount S(1) which is an absolute value of the difference between the correction value T(0) and the correction value T(1), an error tolerance Er(2) to be used for a next correction process is obtained.

In the second correction process, a sum of the correction value T(1) and the initial value Bini is input to the signal value A of the output signal Vo is obtained from the A/D converter 5, and the magnitude relationship between the signal value A and the target value Atg is determined. In the example in FIG. 5, since the signal value A obtained in accordance with the correction value T(1) is smaller than the target value Atg, a portion of the range where the signal value A is expected to be smaller than the current value (a portion of a range smaller than the correction value T(1)) is excluded from the search range. In other words, a value that is smaller than the correction value T(1) serving as the median value by the error tolerance Er (2) is newly set as a minimum correction value Tmin(2). A maximum correction value Tmax(2) is the same as the maximum correction value Tmax(0). As a result, the search range for the new correction value T (Tmin(2) to Tmax(2)), indicated by the hatched line, is further narrower than the previous search range (Tmin(1) to Tmax(1)).

Once the minimum correction value Tmin(2) and the maximum correction value Tmax(2) are determined, a correction value T(2) which is a median of these values is calculated. Based on an adjustment value change amount S(2) which is an absolute value of the difference between the correction value T(1) and the correction value T(2), an error tolerance Er(3) to be used for a next correction process is obtained.

In a third correction process, a sum of the correction value T(2) and the initial value Bini is input to the signal value A of the output signal Vo is obtained from the A/D converter 5, and the magnitude relationship between the signal value A and the target value Atg is determined. In the example in FIG. 5, since the signal value A obtained in accordance with the correction value T(2) is larger than the target value Atg, a portion of the range where the signal value A is expected to be larger than the current value (a portion of a range larger than the correction value T(2)) is excluded from the search range. In other words, a value that is larger than the correction value T(2) serving as the median value by an error tolerance Er(3) is newly set as a maximum correction value Tmax(3). The minimum correction value Tmin(3) is the same as the minimum correction value Tmin(2). As a result, the search range for a new correction value T (Tmin(3) to Tmax(3)), indicated by the hatched line, is further narrower than the previous search range (Tmin(2) to Tmax(2)).

Once the minimum correction value Tmin(3) and the maximum correction value Tmax(3) are determined, a correction value T(3) which is a median of these values is calculated. Based on an adjustment value change amount S(3) which is an absolute value of the difference between the correction value T(2) and the correction value T(3), an error tolerance Er(4) to be used for a next correction process is obtained.

In a fourth correction process, a sum of the correction value T(3) and the initial value Bini is input to the signal value A of the output signal Vo is obtained from the A/D converter 5, and the magnitude relationship between the signal value A and the target value Atg is determined. In the example in FIG. 5, since the signal value A obtained in accordance with the correction value T(3) is larger than the target value Atg, a portion of the range where the signal value A is expected to be larger than the current value (a portion of a range larger than the correction value T(3)) is excluded from the search range. In other words, a value that is larger than the correction value T(3) serving as the median value by an error tolerance Er (4) is newly set as a maximum correction value Tmax(4). A minimum correction value Tmin(4) is the same as the minimum correction value Tmin(2). As a result, the search range for the new correction value T (Tmin(4) to Tmax(4)), indicated by the hatched line, is further narrower than the previous search range (Tmin(3) to Tmax(3)).

As described above, according to this embodiment, each time the new minimum correction value Tmin or the new maximum correction value Tmax is set in the correction process, a width between the minimum correction value Tmin and the maximum correction value Tmax becomes narrower, and a range in which a median value (the correction value T) between the minimum correction value Tmin and the maximum correction value Tmax can take becomes narrower. Therefore, by repeating the correction process, the range of the provisional adjustment value B calculated based on the median value (the correction value T) between the minimum correction value Tmin and the maximum correction value Tmax may be narrowed.

Furthermore, according to this embodiment, when the new minimum correction value Tmin that is larger than the original minimum correction value Tmin is set, a value that is smaller than the median value between the original minimum correction value Tmin and the maximum correction value Tmax (the original median value) by the error tolerance Er is set as the new minimum correction value Tmin. Accordingly, the range of a possible median value in the subsequent correction process (the range from the minimum correction value Tmin to the maximum correction value Tmax) becomes wider by the error tolerance Er when compared with the case where the new minimum correction value Tmin is equal to the original median value (by the binary search).

On the other hand, when the new maximum correction value Tmax that is smaller than the original maximum correction value Tmax is set, a value that is larger than the median value (the original median value) between the original maximum correction value Tmax and the minimum correction value Tmin by the error tolerance Er is set to the new maximum correction value Tmax. Accordingly, the range of a possible median value in the subsequent correction process (the range from the minimum correction value Tmin to the maximum correction value Tmax) becomes wider by the error tolerance Er when compared with the case where the new maximum correction value Tmax is equal to the original median value (by the binary search).

Accordingly, since the range of a possible value for the median value (the correction value T) (the range from the minimum correction value Tmin to the maximum correction value Tmax) becomes wider by the error tolerance Er, even when the signal value A obtained in accordance with the provisional adjustment value B has an error with respect to the original signal value A, the median value (the correction value T) for calculating an optimal adjustment value B is easily included in this range. In other words, even when the signal value A of the output signal Vo of the circuit section 4 has an error, an optimal adjustment value B that acquires a desired output signal Vo may be searched for.

Furthermore, according to this embodiment, the updated error tolerance Er is obtained based on the difference between the latest provisional adjustment value B calculated in the correction process and the provisional adjustment value B one prior to the latest provisional adjustment value B (formula (7)). The updated error tolerance Er is then obtained based on a magnitude of the change in the provisional adjustment value B between one correction process and the next (the adjustment value change amount S). As the adjustment value change amount S becomes larger, the change in the output signal Vo in response to the change in the provisional adjustment value B becomes larger, and the signal value A is more likely to have an error with respect to the original signal value A. Even in such a case, the range between the minimum correction value Tmin and the maximum correction value Tmax is expanded in accordance with the adjustment value change amount S by obtaining the updated error tolerance Er based on the adjustment value change amount S, and therefore, the correction value T for the optimal adjustment value B for which the desired output signal Vo is obtained is easily included in this range. Therefore, it is possible to effectively avoid that the correction value T of the optimal adjustment value B is not included between the minimum correction value Tmin and the maximum correction value Tmax.

Furthermore, according to this embodiment, when the error between the signal value A obtained from the A/D converter 5 and the target value Atg (|Atg−A|) is within the allowable range LIM, the provisional adjustment value B input to the circuit section 4 at this time is determined as a correction result. As a result, when the signal value A obtained from the A/D converter 5 and the target value Atg are close enough that the error (|Atg−A|) between them is within the allowable range LIM, the provisional adjustment value B at this time is determined as the correction result without subsequent repetition of the correction process. Therefore, a period of time required for determining the correction result of the adjustment value B can be reduced.

Furthermore, according to this embodiment, the adjustment value B is calculated from the sum of the correction value T and the initial value Bini. When a new minimum correction value Tmin is set in the correction process, a value obtained by adding the initial value Bini to the correction value T which is the median value between the new minimum correction value Tmin and the maximum correction value Tmax is calculated as the new provisional adjustment value B. When a new maximum correction value Tmax is set in the correction process, a value obtained by adding the initial value Bini to the correction value T which is the median value between the new maximum correction value Tmax and the minimum correction value Tmin is calculated as the new provisional adjustment value B.

Accordingly, since a main operation regarding the search for the adjustment value B is performed using the correction value T (the maximum correction value Tmax, the minimum correction value Tmin, the median value, and the like), a data length of data stored in the storage 6 in the process of calculation is reduced. In particular, when a change in the correction value T in accordance with adjustment of circuit parameters is smaller than a change in the initial value Bini, a data length of data stored in the storage 6 is significantly shorter than when the adjustment value B is used as it is in the calculation related to the search for the adjustment value B, and therefore, a storage region required for the calculation may be effectively reduced.

Figure 6:
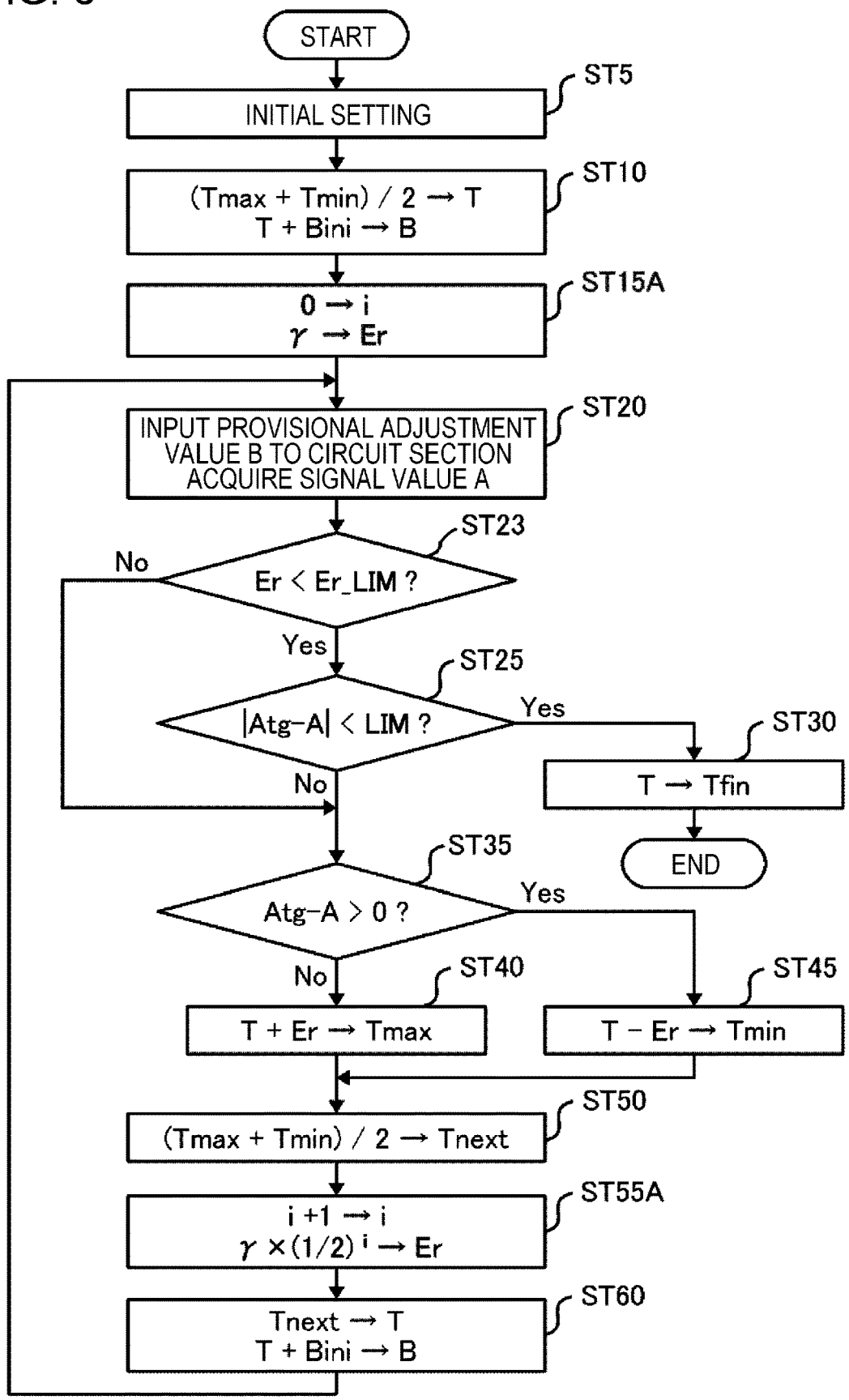
FIG. 6 is a flowchart for describing a modification of the circuit parameter adjustment method in the sensor module according to the first embodiment.

Next, a modification of the circuit parameter adjustment method according to this embodiment will be described with reference to a flowchart in FIG. 6. In the flowchart shown in FIG. 6, step ST15 in the flowchart of FIG. 5 is replaced with step ST15A and step ST55 in the flowchart of FIG. 5 is replaced with step ST55A, and the other steps are the same as those in the flowchart shown in FIG. 5.

In this modification, a method for obtaining an updated error tolerance Er in a correction process is different from that in the flowchart shown in FIG. 4. That is, in step ST15A before starting a correction process, a processing section 7 sets "0" to a variable i, which indicates the number of times the correction process is performed, and sets a constant γ to an error tolerance Er. In step ST55A in the correction process, the processing section 7 adds "1" to a variable i and increments a value of the variable i by "1" for each correction process. The processing section 7 also obtains an updated error tolerance Er based on the variable i indicating the number of times the correction process is performed (the number of times a correction value T is calculated). For example, the processing section 7 calculates the error tolerance Er to be used in a next correction process by the following formula.

$$Er = \gamma \times (\tfrac{1}{2})^i \quad (9)$$

According to formula (9), the processing section 7 halves the error tolerance Er for each correction process. Since a range from a minimum correction value Tmin to a maximum correction value Tmax is reduced to nearly half each time the correction process is performed, the error tolerance Er may be appropriately updated in accordance with a change in the range from the minimum correction value Tmin to the maximum correction value Tmax by halving the error tolerance Er as well.

Note that the processing section 7 may obtain the value of any function that has the number of times the correction processes is performed (the number of times a correction value T is calculated) as a variable as an updated error tolerance Er. This function may be realized using a numerical value table stored in advance, for example, in a storage 6.

Second Embodiment

Next, a sensor module according to a second embodiment will be described. The sensor module according to the second embodiment is different from the sensor module of the first embodiment in a circuit parameter adjustment method. A configuration of the sensor module according to the second embodiment is the same as the sensor module 1 shown in FIG. 1 already described.

In this embodiment, a processing section 7 repeatedly performs the same correction process as in the first embodiment, and then performs a correction result determination process. In this correction result determination process, the processing section 7 determines one of a plurality of candidate values included in an adjustment range centered on a provisional adjustment value B calculated in a last correction process as a result of the correction of the adjustment value. The plurality of candidate values are selected to be uniformly distributed over the adjustment range.

The processing section 7 inputs each of the plurality of candidate values described above to the circuit section 4. Each time the processing section 7 inputs one of the candidate values to a circuit section 4, the processing section 7 obtains from an A/D converter 5 a signal value A of an output signal Vo output from the circuit section 4 in accordance with the input candidate value.

The processing section 7 calculates an error between each of the plurality of signal values A obtained and the target value Atg. The processing section 7 determines one of the plurality of candidate values that corresponds to the signal value A in which a calculated error is smallest as a correction result of the adjustment value B.

Figure 7:
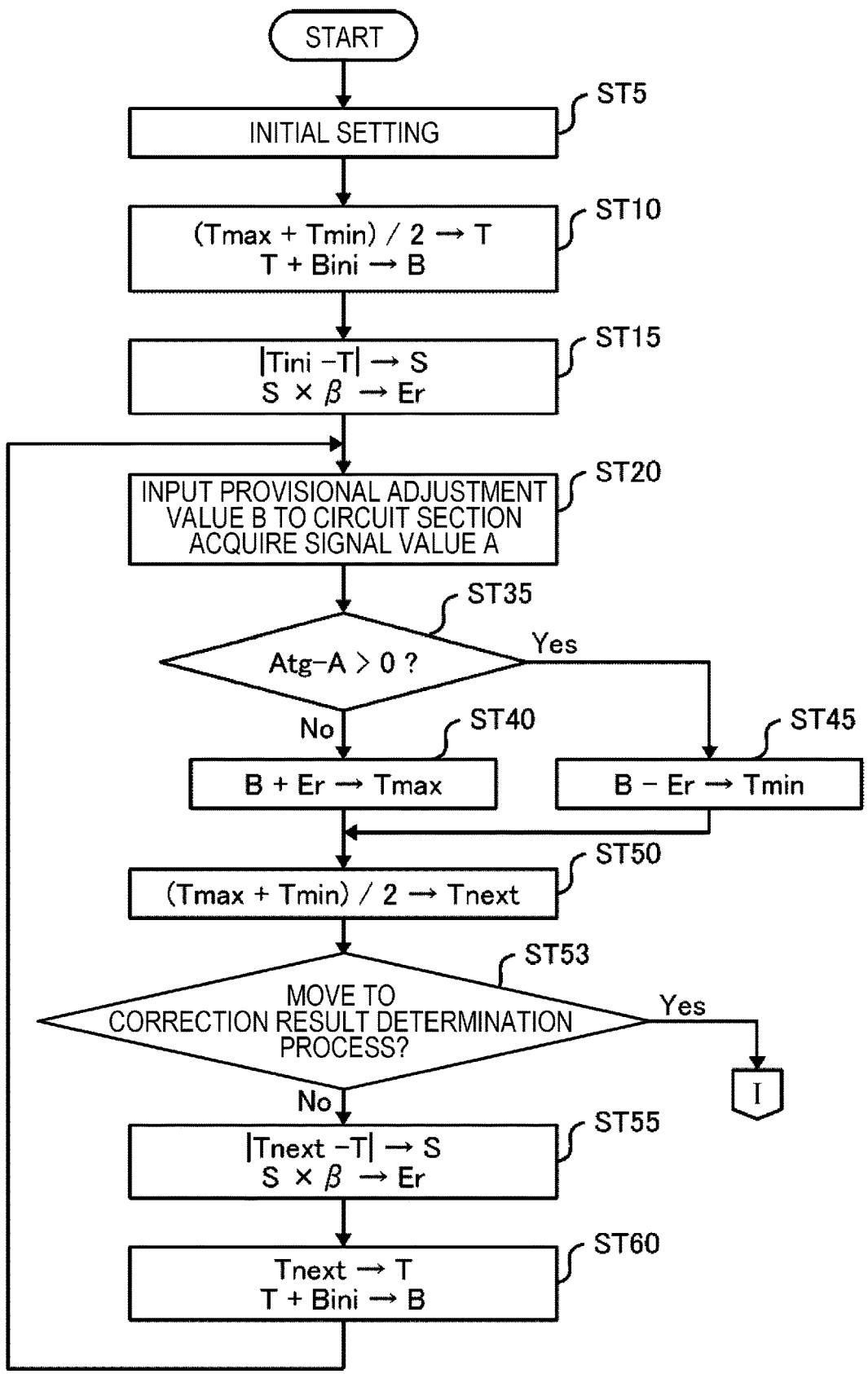
FIG. 7 is a flowchart for describing a circuit parameter adjustment method in the sensor module according to a second embodiment.
Figure 8:
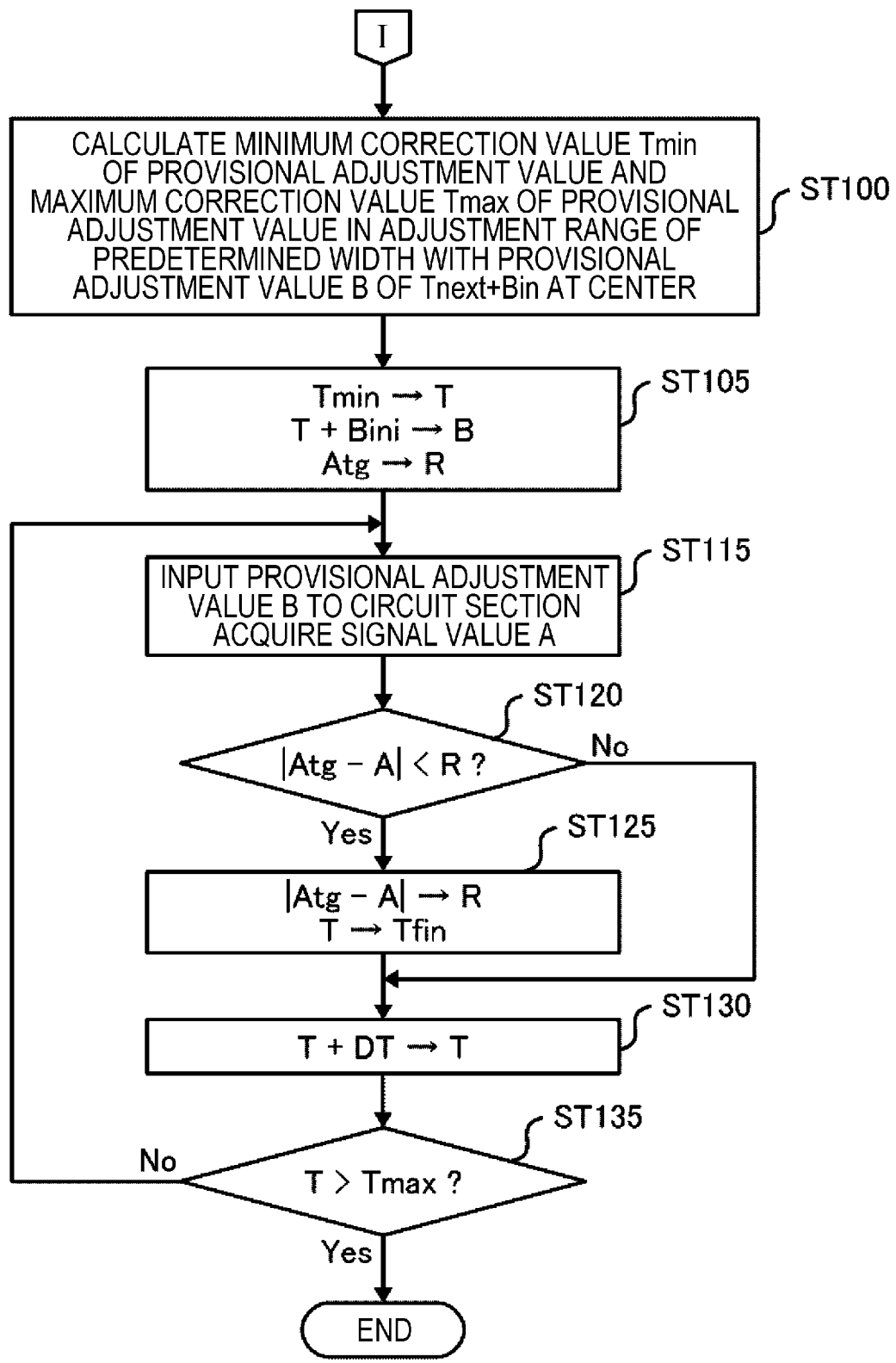
FIG. 8 is a flowchart for describing the circuit parameter adjustment method in the sensor module according to the second embodiment.

FIGS. 7 and 8 are a flowchart for explaining a circuit parameter adjustment method in a sensor module 1 of the second embodiment. The flowchart of FIG. 7 is different from the flowchart of FIG. 4 in that step ST23 to step ST30 in the flowchart of FIG. 4 are omitted so that the process proceeds from step ST20 to step ST35 and step ST53 is inserted between step ST50 and step ST55, and the other steps are the same as those in the flowchart shown in FIG. 4. The flowchart shown in FIG. 8 illustrates an example of the correction result determination process which branches from step ST53 and is executed after the repetition of the correction process.

In the correction process, the processing section 7 determines whether to proceed to the correction result determination process (ST53).

For example, the processing section 7 compares a value obtained by subtracting a new minimum correction value Tmin set in step ST45 from a maximum correction value Tmax or a value obtained by subtracting the minimum correction value Tmin from the new maximum correction value Tmax set in step ST40 with a predetermined threshold value. When these values (Tmax-Tmin) become smaller than a threshold value, the processing section 7 determines that the correction result determination process is to be entered (Yes in ST53). In this case, a range of a possible median value (a correction value T) (a range from the minimum correction value Tmin to the maximum correction value Tmax) is narrower with respect to the threshold value, and therefore, an adjustment range in the correction result determination process may be narrowed to this range. Therefore, the number of candidate values included in the adjustment range may be suppressed while an interval between adjacent candidate values in the adjustment range may be narrowed.

Alternatively, the processing section 7 may determine to enter the correction result determination process when the number of times the correction process is repeatedly performed reaches a certain number (Yes in ST53). Also in this case, a range of a possible median value (a correction value T) (a range from the minimum correction value Tmin to the maximum correction value Tmax) is expected to be narrower than a certain range, and therefore, an adjustment range in the correction result determination process may be narrowed to this certain range. Therefore, the number of candidate values included in the adjustment range may be suppressed while an interval between adjacent candidate values in the adjustment range may be narrowed.

Upon shifting to the correction result determination process, the processing section 7 calculates a minimum correction value T (the minimum correction value Tmin) of the provisional adjustment value B in the adjustment range of a predetermined width centering on the provisional adjustment value B (=Tnext+Bini) corresponding to a correction value Tnext obtained in a most recent step ST50 and a maximum correction value T (a maximum correction value Tmax) of the provisional adjustment value B in the adjustment range (ST100).

The processing section 7 sets the minimum correction value Tmin calculated in step ST100 as the correction value T and sets a sum of the correction value T and the initial value Bini as the provisional adjustment value B. Furthermore, the processing section 7 sets the target value Atg as an initial value of a variable R indicating an error between the target value Atg and the signal value A (ST105).

The processing section 7 inputs a current provisional adjustment value B to the circuit section 4 and obtains the signal value A of the output signal Vo of the circuit section 4 from the A/D converter 5 (ST115). The processing section 7 compares the error between the signal value A obtained from the A/D converter 5 and the target value Atg (|Atg−A|) with the value set in the variable R (ST120). When the error (|Atg−A|) is smaller than the variable R (Yes in ST120), the processing section 7 sets a value of the error (|Atg−A|) to the variable R as a provisional minimum error, and sets a current correction value T as a provisional final correction value Tfin (ST125). Thereafter, the processing section 7 sets a value obtained by adding an adjustment pitch width DT to the correction value T as the correction value T (ST130). The adjustment pitch width DT is an interval between adjacent candidate values in an adjustment range of a certain width.

After updating the correction value T in step ST130, the processing section 7 determines whether the correction value T exceeds the maximum correction value Tmax (ST135). When the correction value T does not exceed the maximum correction value Tmax (No in ST135), the processing section 7 returns to step ST115 and repeats the process from step ST115 onward.

When the correction value T exceeds the maximum correction value Tmax (Yes in ST135), the processing section 7 stores the final correction value Tfin in the storage 6 and terminates the process.

Figure 9:
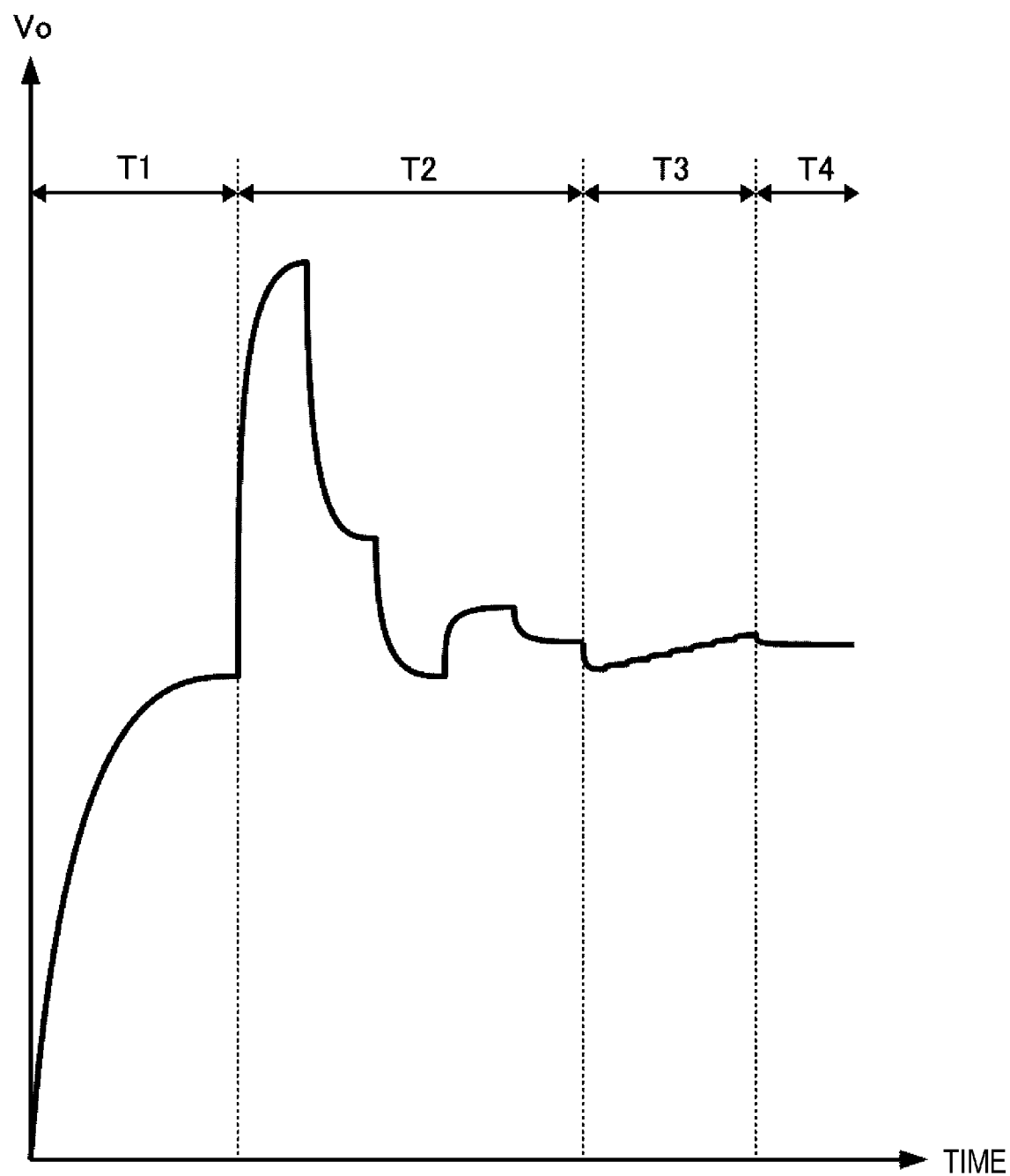
FIG. 9 is a diagram illustrating a change in an output signal of a circuit section when a circuit parameter is adjusted.

FIG. 9 is a diagram illustrating a change in an output signal Vo of the circuit section 4 when circuit parameters are adjusted in this embodiment. A period T1 in FIG. 9 represents an initial setting period before the correction process is executed. In the initial setting period T1, a predetermined adjustment value B is input to the circuit section 4 and the output signal Vo converges to a certain level.

In a period T2 in FIG. 9, the correction process is performed. When the correction process is executed, the output signal Vo changes relatively significantly, as shown in FIG. 9.

In a period T3 in FIG. 9, the correction result determination process is executed, after the correction process. In the correction result determination process, the adjustment value B is changed with a minute adjustment pitch width DT, and therefore, the output signal Vo changes finely within a relatively narrow range.

In a period T4 in FIG. 9, a result of the correction on the adjustment value determined by the correction result determination process is input to the circuit section 4.

As described above, according to this method, since a plurality of candidate values are uniformly distributed in the adjustment range of the correction result determination process, it is possible to accurately determine an optimal adjustment value included in the adjustment range from among the plurality of candidate values. In addition, the repeated correction process prior to the correction result determination process allows the adjustment range to be narrowed down to a narrower range. Accordingly, the interval between adjacent candidate values is narrowed to improve the accuracy of the correction result of the adjustment value and to reduce the number of candidate values to reduce the processing time.

Note that the present disclosure is not limited only to the embodiments described above, but includes various modifications.

Figure 10:
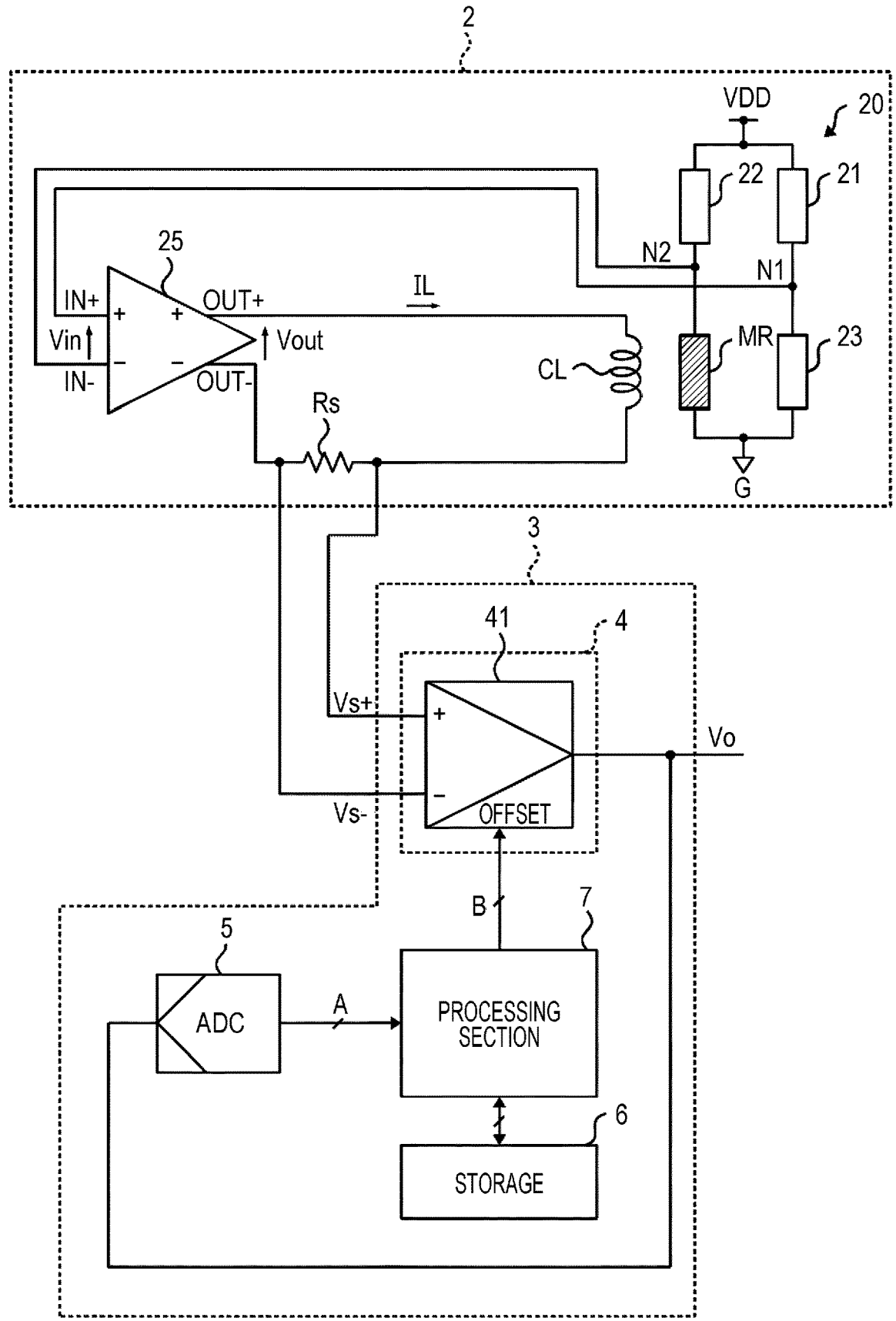
FIG. 10 is a diagram illustrating an example of a configuration of a sensor section.

FIG. 10 is a diagram illustrating an example of a configuration of the sensor section 2. The sensor section 2 in FIG. 10 is a magnetically balanced current sensor that outputs detection signals (Vs+, Vs−) in accordance with a current to be detected, and includes a bridge circuit 20, a coil section CL, a driving amplifier 25, and a shunt resistor Rs.

The bridge circuit 20 has a plurality of resistors, at least some of which have impedances corresponding to a physical quantity, and outputs signals corresponding to the impedances of the plurality of resistors. In the example of FIG. 10, the bridge circuit 20 includes three resistors R21, R22, and R23 and a magnetoresistive element MR. A circuit including the resistors R21 and R23 connected in series and a circuit including the resistor R22 and a magnetoresistive element MR connected in series are connected in parallel between a supply voltage VDD and the ground G. A signal Vin, which varies in accordance with a resistance value of the magnetoresistive element MR, is output from a node N1 at a connection midpoint of the resistors R21 and R23 and a node N2 at a connection midpoint of the resistor R22 and the magnetoresistive element MR. An impedance of the magnetoresistive element MR changes in response to a magnetic field caused by a current to be detected.

The driving amplifier 25 drives the coil section CL in accordance with the signal Vin (between the nodes N1 and N2) output by the bridge circuit 20.

The shunt resistor Rs generates a voltage corresponding to a coil current IL flowing in the coil section CL as a detection signal.

In the sensor section 2 shown in FIG. 10, the coil current IL is controlled so that a magnetic field caused by the coil current IL of the coil section CL cancels the magnetic field acting on the magnetoresistive element MR by the current to be detected. As a result, since the coil current IL is roughly proportional to the current to be detected, the detection signal generated in the shunt resistor Rs has a voltage roughly proportional to the current to be detected.

Figure 11:
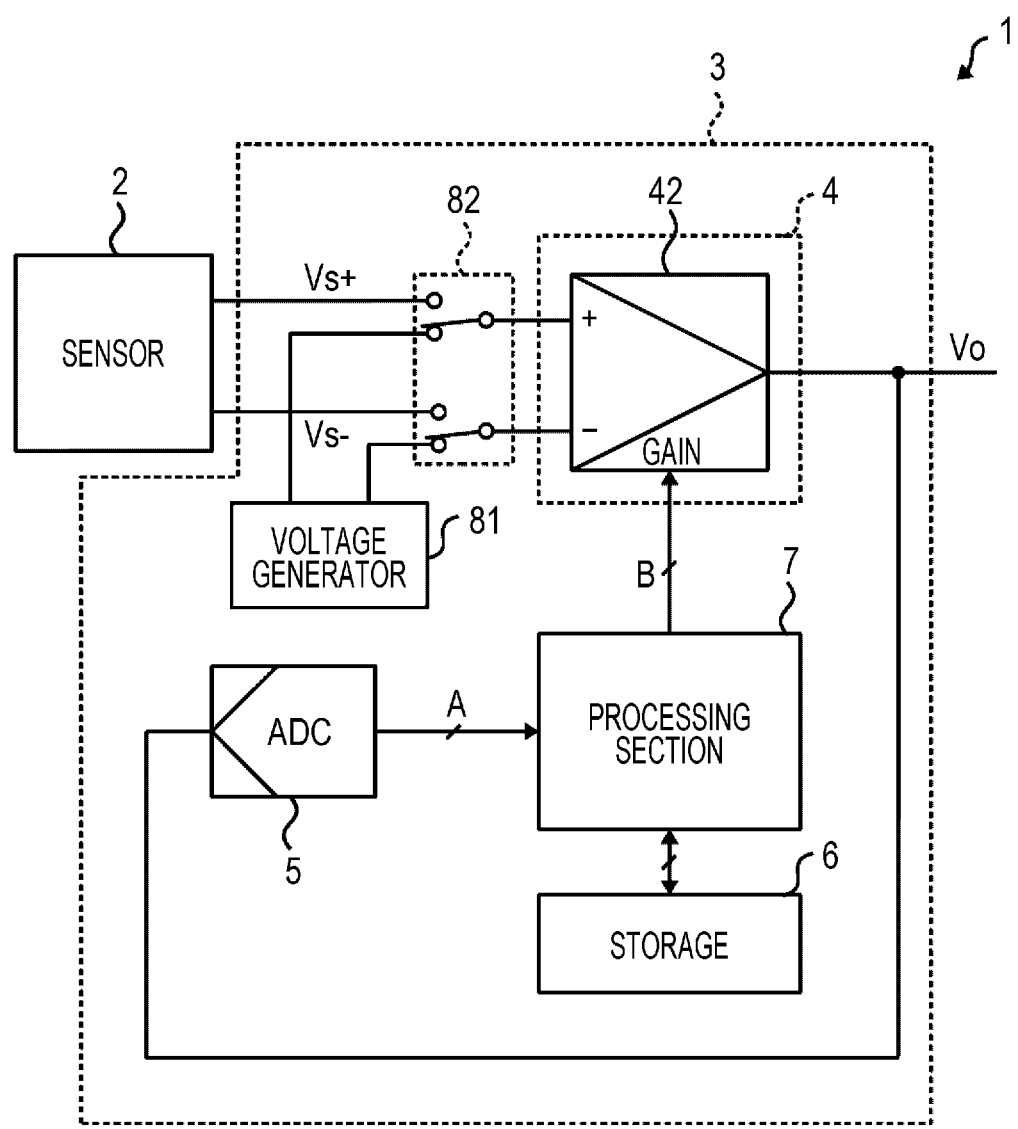
FIG. 11 is a diagram illustrating an example of a configuration of a sensor module capable of adjusting a gain of an amplifier section.
Figure 12:
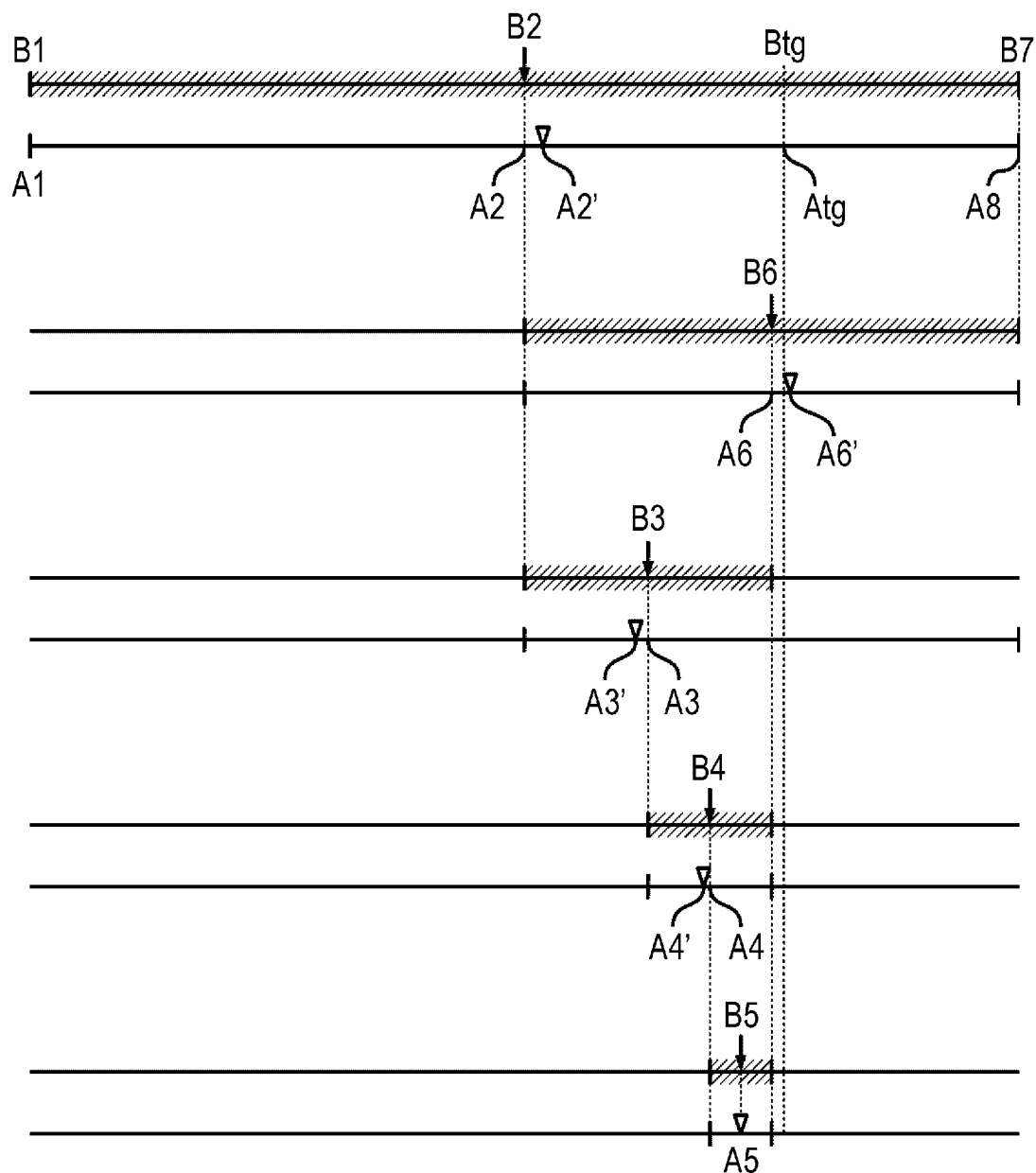
FIG. 12 is a diagram illustrating a method for searching for an adjustment value of the circuit parameter using the binary search.
Figure 13:
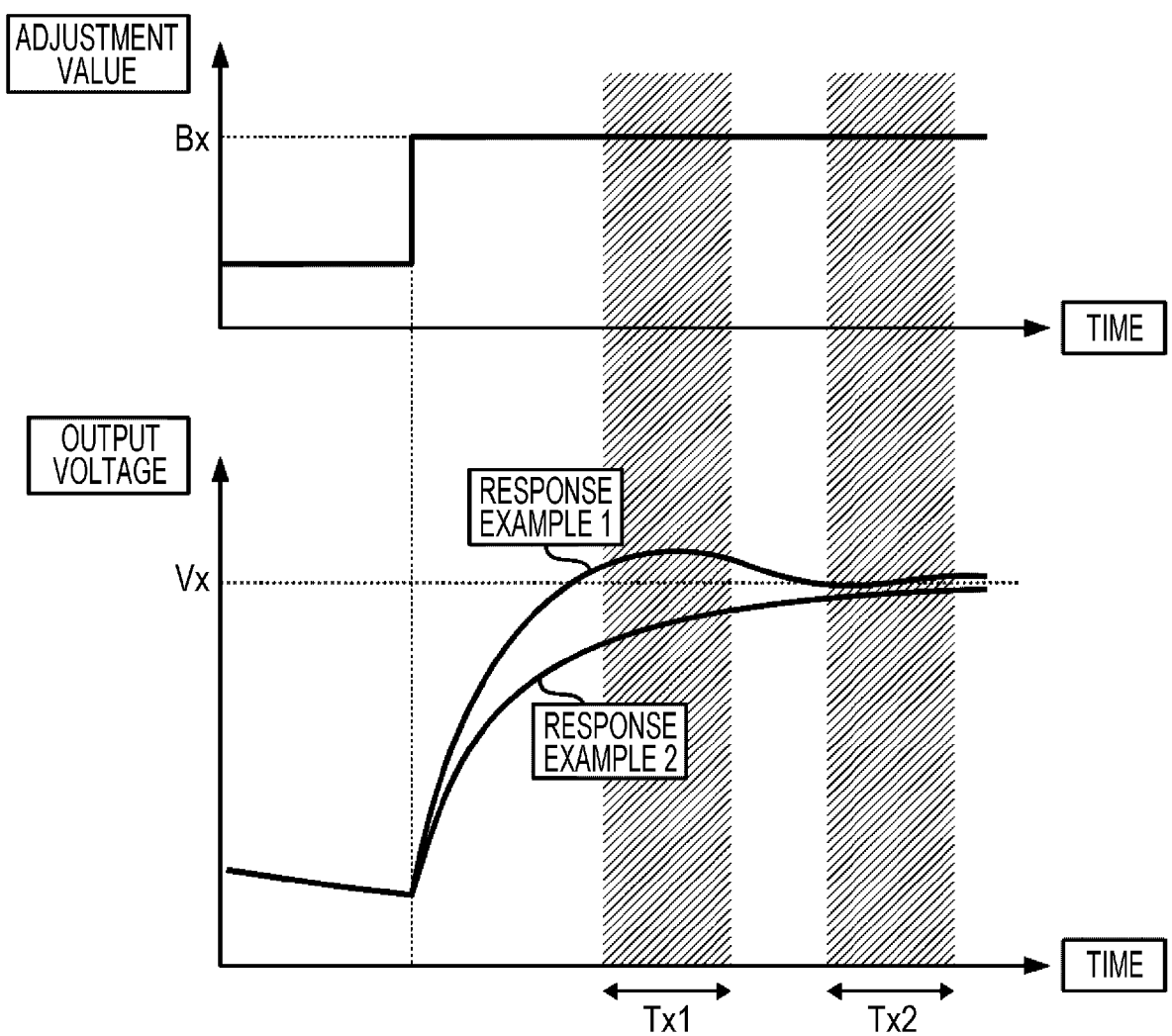
FIG. 13 is a diagram illustrating a change in a level of an output signal in accordance with a change in the adjustment value.

In the above embodiments, the adjustment of the offset of the amplifier section is taken as an example, but the circuit parameter to be adjusted is not limited to the offset, but may be, for example, a gain of the amplifier section, as shown in the example in FIG. 11.

FIG. 11 is a diagram illustrating an example of a configuration of the sensor module 1 capable of adjusting a gain of the amplifier section. In the sensor module 1 shown in FIG. 11, the amplifier section 41 of the circuit section 4 in the sensor module 1 shown in FIG. 1 is replaced with an amplifier section 42, and a voltage generator section 81 and a switch circuit 82 are added to the circuit device 3, and the other configuration is the same as the sensor module 1 shown in FIG. 1.

In the example of FIG. 11, the amplifier section 42 can adjust a gain of the output signal Vo with respect to the input signals (Vs+, Vs−) in accordance with the adjustment value B input from the processing section 7. In the operating mode for the gain adjustment, the amplifier section 42 generates a predetermined reference voltage from the voltage generator 81 and switches the switch circuit 82 so that the reference voltage is input to the amplifier section 42 instead of the signals (Vs+, Vs−) of the sensor section 2. The process of searching for the optimal adjustment value B may be the same as in the case of the offset adjustment already described.

Although the circuit device that receives an output signal from the sensor section and performs predetermined signal processing is taken as an example, this embodiment is not limited to this example.

In other words, the circuit device of this embodiment is not limited to the circuit device included in the sensor module, as long as the circuit device includes a circuit section capable of adjusting circuit parameters in accordance with an input adjustment value. The circuit section included in the circuit device is not limited to that including an amplifier section, but the circuit section may include a circuit other than an amplifier section capable of adjusting circuit parameters.

What is claimed is:

1. A circuit device, comprising:
   a circuit section that has circuit parameters relating to characteristics of an output signal and that adjust the circuit parameters in accordance with an input adjustment value;
   an analog-to-digital converter that converts an analog signal output from the circuit section into a digital signal and that outputs a signal value corresponding to a level of the output signal; and
   a processing section that is configured to repeatedly perform a correction process of correcting the adjustment value so that the signal value output from the analog-to-digital converter becomes close to a target value in an operation mode for adjustment of the circuit parameters, wherein:
   the correction process includes:
      obtaining, after a provisional adjustment value that is the adjustment value in a correction step is input to the circuit section, the signal value of the output signal output from the circuit section, from the analog-to-digital converter in accordance with the input provisional adjustment value, and
      correcting the provisional adjustment value in accordance with the obtained signal value, and
   the correcting includes:
      determining the magnitude relationship between the obtained signal value and the target value,
      setting, when a first determination result is obtained in the determining, a value that is smaller than a median value between a preset minimum value and a preset maximum value by an error tolerance and that is larger than the original minimum value as the new minimum value,
      setting, when a second determination result that is opposite to the first determination result is obtained in the determining, a value that is larger than the median value by the error tolerance and that is smaller than the original maximum value, as the new maximum value, and obtaining the new provisional adjustment value based on a median value between the minimum value newly set in the setting and the maximum value or a median value between the maximum value newly set in the setting and the minimum value.

2. The circuit device according to claim 1, wherein the correction process further includes updating the error tolerance used in the setting in the next correction process to a value smaller than the original error tolerance.

3. The circuit device according to claim 2, wherein, in the updating, the error tolerance after updating is obtained based on a difference between the latest provisional adjustment value that is obtained in the obtaining and the provisional adjustment value one prior to the latest provisional adjustment value.

4. The circuit device according to claim 2, wherein, in the updating, the error tolerance after the updating is obtained based on the number of times the obtaining is performed.

5. The circuit device according to claim 1, wherein
the processing section is configured to perform a correction result determination process of determining, as a result of correction on the adjustment value, one of a plurality of candidate values included in an adjustment range having the provisional adjustment value, that is obtained in the obtaining in the last correction process that is repeatedly performed, at a center,
the plurality of candidate values are uniformly distributed in the adjustment range, and
the correction result determination process includes:
obtaining, from the analog-to-digital converter, every time each of the plurality of candidate values is input to the circuit section, the signal value of the output signal output from the circuit section in accordance with the input one of the candidate values,
calculating errors between the target value and a plurality of the signal values obtained for the plurality of candidate values in the obtaining, and
determining one of the candidate values that corresponds to the signal value having the smallest error calculated in the calculating as a result of correction of the adjustment value.

6. The circuit device according to claim 5, wherein, when a value obtained by subtracting the minimum value newly set in the setting from the maximum value or a value obtained by subtracting the minimum value from the maximum value newly set in the setting is smaller than a threshold value, or when the number of times the correction process is repeatedly performed reaches a certain number, the processing section enters from the correction process to the correction result determination process.

7. The circuit device according to claim 1, wherein the correction process includes determining, as a result of correction of the adjustment value, the provisional adjustment value input to the circuit section in the obtaining, when an error between the signal value obtained in the obtaining and the target value is included in an allowable range.

8. The circuit device according to claim 1, wherein
the adjustment value is a sum of a correction value and an initial value, and
in the obtaining, a value obtained by adding the initial value to the correction value that is the median value between the minimum value newly set in the setting and the maximum value or a value obtained by adding the initial value to the correction value that is the median value between the maximum value newly selected in the setting and the minimum value is calculated as the new provisional adjustment value.

9. The circuit device according to claim 1, wherein
the circuit section includes an amplifier section that outputs the output signal obtained by amplifying an input signal,
the amplifier section adjusts an offset component of the output signal in accordance with the adjustment value or adjusts a gain of the output signal output in response to the input signal in accordance with the adjustment value.

10. A sensor module, comprising:
a circuit device, comprising:
a circuit section that has circuit parameters relating to characteristics of an output signal and that adjust the circuit parameters in accordance with an input adjustment value;
an analog-to-digital converter that converts an analog signal output from the circuit section into a digital signal and that outputs a signal value corresponding to a level of the output signal; and
a processing section that is configured to repeatedly perform a correction process of correcting the adjustment value so that the signal value output from the analog-to-digital converter becomes close to a target value in an operation mode for adjustment of the circuit parameters,
wherein the correction process includes:
obtaining, after a provisional adjustment value that is the adjustment value in a correction step is input to the circuit section, the signal value of the output signal output from the circuit section, from the analog-to-digital converter in accordance with the input provisional adjustment value, and
correcting the provisional adjustment value in accordance with the obtained signal value, and
the correcting includes:
determining the magnitude relationship between the obtained signal value and the target value,
setting, when a first determination result is obtained in the determining, a value that is smaller than a median value between a preset minimum value and a preset maximum value by an error tolerance and that is larger than the original minimum value as the new minimum value,
setting, when a second determination result that is opposite to the first determination result is obtained in the determining, a value that is larger than the median value by the error tolerance and that is smaller than the original maximum value, as the new maximum value, and
obtaining the new provisional adjustment value based on a median value between the minimum value newly set in the setting and the maximum value or a median value between the maximum value newly set in the setting and the minimum value,
wherein:
the circuit section includes an amplifier section that outputs the output signal obtained by amplifying an input signal, and the amplifier section adjusts an offset component of the output signal in accordance with the adjustment value or adjusts a gain of the output signal output in response to the input signal in accordance with the adjustment value, and
a sensor section that outputs a signal in accordance with a physical amount, wherein the amplifier section of the circuit device receives a signal output from the sensor section as the input signal.

11. The sensor module according to claim 10, wherein
the sensor section outputs a detection signal corresponding to a current to be detected, and
the amplifier section receives the detection signal as the input signal.

12. The sensor module according to claim 11, wherein the sensor section includes:
a bridge circuit that includes a plurality of resistors, at least a number of which have impedances corresponding to physical amounts and that outputs signals corresponding to the impedances of the plurality of resistors,
a coil section,
a driving amplifier that drives the coil section in accordance with a signal output from the bridge circuit, and
a shunt resistor that generates a voltage corresponding to a coil current supplied through the coil section as the detection signal,
at least a number of the resistors included in the bridge circuit are magnetoresistive elements having impedances changed due to a magnetic field of the current to be detected, and
the coil current is controlled such that a magnetic field caused by the coil current cancels a magnetic field acting on the magnetoresistive elements due to the current to be detected.

13. A circuit parameter adjustment method executed by a processing section of a circuit device, the circuit device comprising:
a circuit section that has circuit parameters relating to characteristics of an output signal and that adjust the circuit parameters in accordance with an input adjustment value; and
an analog-to-digital converter that converts an analog signal output from the circuit section into a digital signal and that outputs a signal value corresponding to a level of the output signal, wherein:
the processing section repeatedly performs a correction process of correcting the adjustment value so that the signal value output from the analog-to-digital converter becomes close to a target value,
the correction process includes:
obtaining, after a provisional adjustment value that is the adjustment value in a correction step is input to the circuit section, the signal value of the output signal output from the circuit section, from the analog-to-digital converter in accordance with the input provisional adjustment value, and
correcting the provisional adjustment value in accordance with the obtained signal value, and
the correcting includes:
determining the magnitude relationship between the obtained signal value and the target value,
setting, when a first determination result is obtained in the determining, a value that is smaller than a median value between a preset minimum value and a preset maximum value by an error tolerance and that is larger than the original minimum value as the new minimum value,
setting, when a second determination result that is opposite to the first determination result is obtained in the determining, a value that is larger than the median value by the error tolerance and that is smaller than the original maximum value, as the new maximum value, and
calculating the new provisional adjustment value based on a median value between the minimum value newly set in the setting and the maximum value or a median value between the maximum value newly set in the setting and the minimum value.

14. The circuit parameter adjustment method according to claim 13, wherein the correction process further includes updating the error tolerance used in the setting in the next correction process to a value smaller than the original error tolerance.

15. The circuit parameter adjustment method according to claim 13, wherein:
the processing section performs a correction result determination process of determining, as a result of correction on the adjustment value, one of a plurality of candidate values included in an adjustment range having the provisional adjustment value, that is obtained in the obtaining in the last correction process that is repeatedly performed, at a center,
the plurality of candidate values are uniformly distributed in the adjustment range, and
the correction result determination process includes:
obtaining, from the analog-to-digital converter, every time each of the plurality of candidate values is input to the circuit section, the signal value of the output signal output from the circuit section in accordance with the input one of the candidate values,
calculating errors between the target value and a plurality of the signal values obtained for the plurality of candidate values in the obtaining, and
determining one of the candidate values that corresponds to the signal value having the smallest error calculated in the calculating as a result of correction of the adjustment value.

* * * * *